(12) United States Patent
Zelner et al.

(10) Patent No.: US 10,923,286 B2
(45) Date of Patent: Feb. 16, 2021

(54) METHOD AND APPARATUS FOR COMPENSATING FOR HIGH THERMAL EXPANSION COEFFICIENT MISMATCH OF A STACKED DEVICE

(71) Applicant: NXP USA, Inc., Austin, TX (US)

(72) Inventors: Marina Zelner, Burlington (CA); Andrew Vladimir Claude Cervin, Oakville (CA); Edward Horne, Burlington (CA)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/901,468

(22) Filed: Feb. 21, 2018

(65) Prior Publication Data
US 2019/0259540 A1   Aug. 22, 2019

(51) Int. Cl.
*H01L 21/00* (2006.01)
*H01G 7/06* (2006.01)
*H01L 21/3115* (2006.01)
*H01L 23/373* (2006.01)
*H01L 49/02* (2006.01)

(52) U.S. Cl.
CPC ........... *H01G 7/06* (2013.01); *H01L 21/3115* (2013.01); *H01L 23/3735* (2013.01); *H01L 28/55* (2013.01); *H01L 28/91* (2013.01)

(58) Field of Classification Search
CPC . H01L 21/3115; H01L 23/3735; H01L 28/55; H01L 28/91
See application file for complete search history.

(56) References Cited

U.S. PATENT DOCUMENTS

| | | | |
|---|---|---|---|
| 4,242,157 A | 12/1980 | Gehle | |
| 5,645,976 A | 7/1997 | Azuma | |
| 5,745,335 A * | 4/1998 | Watt | H01G 4/232 257/E21.011 |
| 5,976,927 A | 11/1999 | Hsieh et al. | |
| 5,998,236 A | 12/1999 | Roeder et al. | |
| 6,498,097 B1 | 12/2002 | Park et al. | |
| 6,617,062 B2 | 9/2003 | Chang | |

(Continued)

FOREIGN PATENT DOCUMENTS

| JP | 07273297 A | 10/1995 |
|---|---|---|
| JP | 2007088437 A | 4/2007 |

OTHER PUBLICATIONS

Betzen, Ashlea, "Physical Properties of Barium Borate Glasses Determined Over a Wide Range of Composites", Journal of Non-Crystalline Solids, May 2000, 2 pages.

(Continued)

*Primary Examiner* — Mounir S Amer
*Assistant Examiner* — Alexander Belousov

(57) ABSTRACT

A device that incorporates teachings of the subject disclosure may include, for example, a multilayer initial oxide on a silicon substrate, where the multilayer initial oxide comprises amorphous polysilicates and a group one metal or a group two metal; a first electrode layer on the multilayer initial oxide; a dielectric layer on the first electrode layer; a second electrode layer on the dielectric layer, where an edge alignment spacing between at least one pair of corresponding electrode edges of two electrode layers of the capacitor is two microns or less; and connections for the first and second electrode layers. Other embodiments are disclosed.

20 Claims, 13 Drawing Sheets

(56) References Cited

U.S. PATENT DOCUMENTS

| | | |
|---|---|---|
| 6,638,872 B1 | 10/2003 | Croswell et al. |
| 6,764,864 B1 | 7/2004 | Li et al. |
| 7,402,853 B2 | 7/2008 | Kim et al. |
| 8,021,778 B2 | 9/2011 | Snyder et al. |
| 8,112,852 B2 | 2/2012 | Mendolia et al. |
| 8,154,850 B2 | 4/2012 | Zelner et al. |
| 8,535,396 B2 | 9/2013 | Snyder et al. |
| 8,664,704 B2 | 3/2014 | Cervin et al. |
| 8,693,162 B2 | 4/2014 | Capanu et al. |
| 9,404,175 B2 | 8/2016 | Zelner et al. |
| 10,115,527 B2 | 10/2018 | Zelner et al. |
| 10,297,658 B2 | 5/2019 | Zelner et al. |
| 2001/0002872 A1 | 6/2001 | Dhuler et al. |
| 2002/0036064 A1 | 3/2002 | DeOrnellas et al. |
| 2002/0102814 A1 | 8/2002 | Olsen |
| 2003/0022030 A1 | 1/2003 | Chang et al. |
| 2003/0080363 A1 | 5/2003 | Maruyama et al. |
| 2004/0017270 A1 | 1/2004 | Nagra et al. |
| 2004/0028838 A1 | 2/2004 | Chang et al. |
| 2004/0061155 A1 | 4/2004 | Yamanobe |
| 2004/0069991 A1 | 4/2004 | Dunn et al. |
| 2006/0035023 A1 | 2/2006 | Chang et al. |
| 2006/0082423 A1 | 4/2006 | Kim et al. |
| 2007/0088437 A1 | 4/2007 | Betz et al. |
| 2008/0278887 A1 | 11/2008 | Zelner et al. |
| 2012/0218733 A1 | 8/2012 | Capanu et al. |
| 2013/0241036 A1 | 9/2013 | Cervin et al. |
| 2013/0330903 A1* | 12/2013 | Malhotra ............... H01L 28/56 438/396 |
| 2014/0072816 A1 | 3/2014 | Lee |
| 2014/0216921 A1 | 8/2014 | Zelner et al. |
| 2016/0268048 A1 | 9/2016 | Zelner |
| 2017/0365656 A1 | 12/2017 | Zelner et al. |
| 2018/0247997 A1 | 8/2018 | Zelner et al. |
| 2019/0122826 A1 | 4/2019 | Zelner et al. |
| 2019/0123131 A1 | 4/2019 | Cervin et al. |

OTHER PUBLICATIONS

Fluegel, Alexander, "Thermal Expansion Calculation of Silicate Glasses at 210C, Based on the Systematic Analysis of Global Databases", http://glassproperties.com, Dec. 2007, 25 pages.

Henderson, Grant S. et al., "The Structure of Silicate Glasses and Melts", Elements, vol. 2, Oct. 2006, pp. 269-273.

Shermer, Herman F., "Thermal Expansion of Binary Alkali Silicate Glasses", Journal of Research of the National Bureau of Standards, vol. 57, No. 2, Aug. 1956, 5 pages.

Stolyar, S. V. et al., "Thermal Expansion of Glasses in the SrO—B2O3—SiO2 System", Jul. 10, 2008, 2 pages.

Stoyler, S. V. et al., "Viscosity of Glass Melts in the SrO—B2O3—SiO2 System", Glass Physics and Chemistry, 2008, vol. 34, No. 4, Mar. 4, 2008, pp. 509-511.

Ahn, J. et al., "Composition and Structure of the Al2O3{0001}-(1×1) Surface", Elsevier, Apr. 22, 1997, pp. 121-131.

Deloffre, E. et al., "Electrical Properties in Low Temperature Range (5K-300K) of Tantalum Oxide Dielectric MIM Capacitors", Elsevier, www.elseiver.com/locate/microrel, Jan. 28, 2005, pp. 925-928.

European Patent Office, , "Extended European Search Report dated Jul. 12, 2019", for Application No. 19158238.6, dated Jul. 12, 2019, 9 pages.

European Patent Office, , "Extended European Search Report dated Jul. 20, 2018", for EP Application No. 18158656.1, dated Jul. 20, 2018, 10 pages.

Kapoor, S. et al., "Physical Properties of Barium Borosilicate Glasses Related to Atomic Structure", Jun. 2003, 1 page.

Mysen, Bjorn O. et al., "Silicate Glasses and Melts: Properties and Structure", Elseiver, Jun. 16, 2005, p. 360.

* cited by examiner

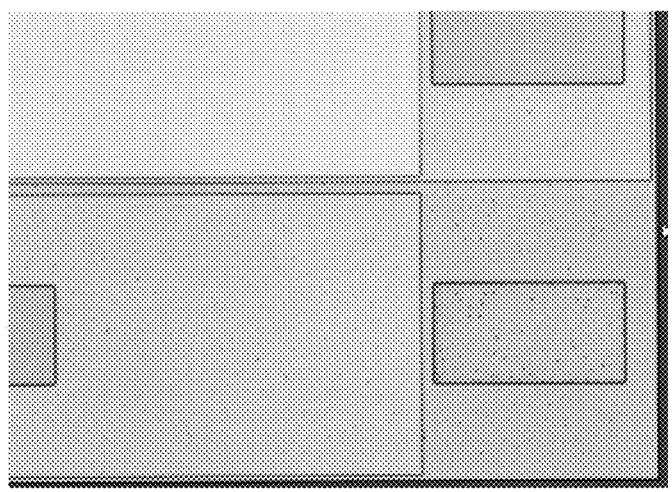
202
FIG. 2C
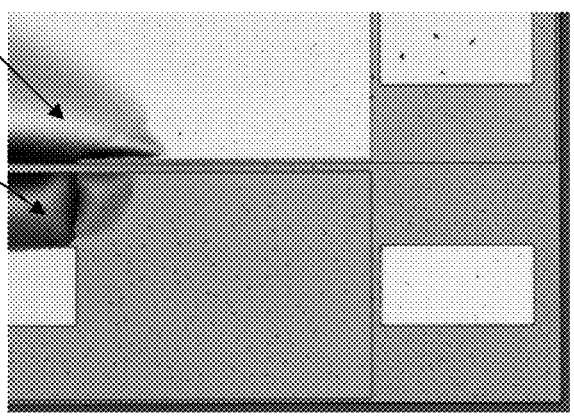
299
299
201
FIG. 2B
299
200
FIG. 2A

400

500

METHOD AND APPARATUS FOR COMPENSATING FOR HIGH THERMAL EXPANSION COEFFICIENT MISMATCH OF A STACKED DEVICE

FIELD OF THE DISCLOSURE

This present invention relates, in general, to a stacked device, and more particularly, to a method and apparatus for compensating for high Thermal Expansion Coefficient (TEC) mismatch of a stacked device to the underlying dielectric.

BACKGROUND

Ferroelectric capacitors have various uses in RF systems including as voltage-tunable devices. Some benefits of ferroelectric capacitors are small size, integration of different values and functions of capacitance, and low cost. Applications for ferroelectric capacitors may include tunable filters, voltage controlled oscillators, tunable phase shifters, tunable matching networks, low-impedance power supplies, decoupling high-frequency signals at an IC bonding pad, or others.

Integrated circuits including ferroelectric capacitors may, for example, be used in portable electronics for low-power wireless communication (e.g., cellular phones, pagers, PDAs, and so forth), directional antenna systems, high clock-rate microphones, miniature DC to DC converters, or other devices.

Electrically tunable capacitors are commercially available such as on Sapphire and polycrystalline Alumina substrates. These devices can be attractive for wireless communication due to their high RF Q-factors, good reliability, and very good power handling.

High cost is a disadvantage limiting commercialization and attractiveness to high-volume manufacturers. Sapphire and Alumina wafer cost, dicing and thinning cost are the main cost drivers. With lower Si substrate cost and it's lower thinning and dicing cost, tunable dielectrics fabricated on Si may be significantly cheaper, such as fifty percent of the cost.

A Barium Strontium Titanate (BST) stacked device can include single or multiple layers of tunable dielectric and platinum electrodes. These materials (e.g., TEC of 5.0-8.8) can have a very high thermal expansion coefficient (TEC) mismatch with a silicon (Si) substrate (e.g., TEC of 3.5) and a standard initial oxide $SiO_2$ (TEC of 0.5). Standard $SiO_2$ initial oxide is typically thermally grown (Thermal Oxide), or deposited Low Temperature Oxide (LTO). The deposition technique can change the physical density of the LTO and the adhesion strength to the substrate, but it does not change the TEC of material.

Fabrication of tunable BST utilizes multiple high-temperature processes. Maintaining the stack integrity is a challenge. The initial oxide layer based on use of $SiO_2$ is carrying the highest stress due to its position in the stack and extremely low TEC. Fabrication of BST tunable integrated capacitors on Si substrate and $SiO_2$ have been seen to result in different degrees of delamination of devices linked to initial oxide cracking.

BRIEF DESCRIPTION OF THE DRAWINGS

Reference will now be made to the accompanying drawings, which are not necessarily drawn to scale, and wherein:

FIGS. 2A, 2B, 2C illustrate images of tunable devices.

DETAILED DESCRIPTION

Figure 1A:
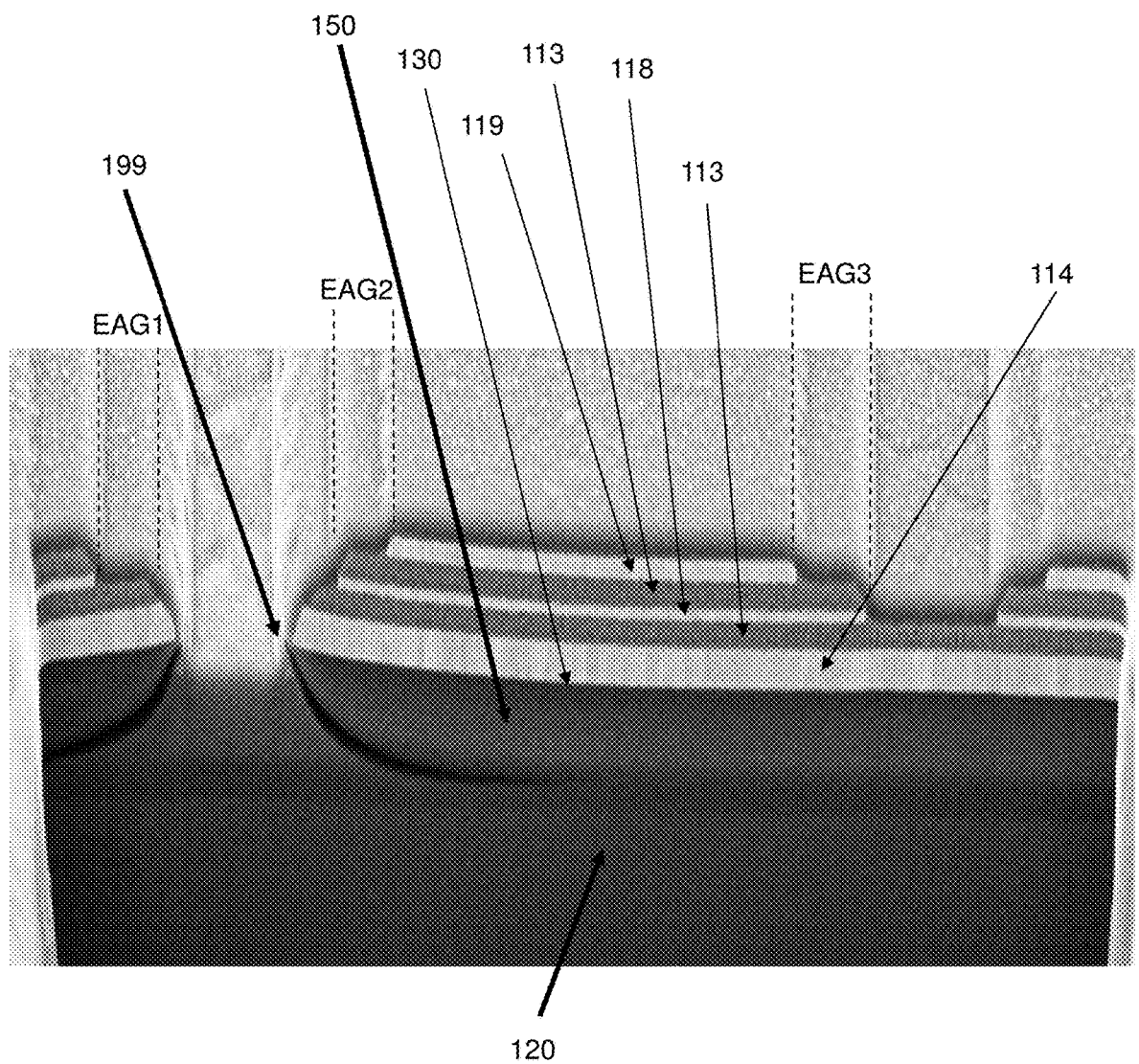
FIGS. 1A and 1B illustrate focused ion beam cross-section images of tunable devices.

One or more of the exemplary embodiments provide a method of forming, and a device having, a multilayer initial oxide with a higher TEC while maintaining smoothness of pure $SiO_2$. In one embodiment, the method can include depositing or otherwise forming $SiO_2$ layers along with a modifier layer without needing doping by high-mobility elements such as phosphorous or boron forming phosphosilicate glass (PSG) or borophosphosilicate glass BPSG. The high-mobility elements can migrate to a tunable dielectric film and degrade the performance of the device.

In one or more embodiments, a modified initial oxide can be provided which prevents delamination of a tunable platinum/BST (or other electrode/dielectric materials) capacitor stack from Si substrates.

In one or more embodiments, the TEC of the initial oxide is increased by layering the initial oxide with in-situ created amorphous glasses such as of Me(+2)O—$TiO_2$—$SiO_2$ system. For example, these glasses can have a TEC in the range of 3.0-6.0.

In one or more embodiments, a first layer of $SiO_2$ can be directly deposited and/or thermally grown on an Si substrate. For instance, the first $SiO_2$ layer can be 25-50% of a desired final thickness of the initial oxide, although other thicknesses can be utilized. A modifier layer can then be deposited on the top of the first $SiO_2$ layer. For example, the modifier layer can be deposited using the same technique and/or material employed for deposition of a tunable dielectric, although other techniques and/or materials can be utilized. Another $SiO_2$ layer can be deposited on the top of the modifier layer. The resulting multilayer initial oxide mirror can then be annealed in order to cause a chemical reaction resulting in amorphous poly-silicates. The annealing also causes diffusion of the modifier species or ions (e.g., metal ions) from the modifier layer into the $SiO_2$ layers resulting in amorphous poly-silicate layers extending a short way into the $SiO_2$ layers. In one embodiment, the minimum thickness of the $SiO_2$ layers can be determined by the diffusion of the oxide modifiers. The $SiO_2$ layers can be selected to be thick enough to prevent the modifier species via diffusion from reaching either the top or bottom interface of the $SiO_2$ layers (e.g., the interface with the Si substrate or the interface with an electrode layer or adhesion layer. In one or more embodiment, the annealing temperature can be at a temperature(s) of 950-1100 C, although other temperatures can be utilized such as based on a number of factors including the particular modifier layer being utilized, and/or the thicknesses of the SiO$_2$ layers and modifier layer. In one or more embodiments, there could be one or more anneals to achieve desired properties.

In one or more embodiments, the modifier layer can be selected so as to allow diffusion of modifier species or ions (e.g., metal ions) into the silicon dioxide layers when subject to annealing at a particular temperature. In one or more embodiments, the modifier layer is selected such that the particular annealing(s) cause the alkali or alkali earth metals to chemically react at the interfaces between the modifier layer and the SiO$_2$ to form alkali or alkali earth silicates which will further melt with the SiO$_2$ layer and form more alkali or alkali earth silicates with a higher TEC extending a short way into the SiO$_2$ layers. In one or more embodiments, the modifier layer can be of various types including amorphous, crystalline, monocrystalline, and so forth.

In one or more embodiments the modifier layer can be an in-situ deposited multilayer. For example, the process can use sputter deposition in different ambient compositions (e.g., reactive/not reactive). In one or more embodiments, the silicon dioxide layers can be the same or different thickness using the same or different deposition or growth techniques. For example: grown thermal oxide SiO$_2$ layer then modifier layer then deposited LPCVD SiO$_2$ layer.

In one or more embodiments, the use of the modifier layer and resulting annealed multilayer initial oxide can modify the TEC of the SiO$_2$ layers which have a low TEC (e.g., lowest TEC in the stack) and which are a foundation for the devices. Without the modifier layer the stress from the TEC mismatch (between the SiO$_2$ and device stack) can exceed the mechanical strength of the SiO$_2$ layer and fracture the SiO$_2$ or exceed the adhesion of the bottom electrode to the SiO$_2$ layer and delaminate the bottom electrode. If a crack were to occur in a device, it can be because stack strain is exceeding a mechanical strength of a layer, such as an SiO$_2$ layer, which the exemplary embodiments compensate for by utilizing the modifier layer and annealing technique to achieve a desired TEC and avoid cracking and delamination.

In one or more embodiments, RF performance for tunable capacitors is increased or improved based on acoustic cancellation and a high degree of matching between top and bottom capacitors. For example, acoustic cancellation can be maximal or increased with a coincident or close-to-coincident device topology, such as with less than 2 microns of spacing between corresponding electrode edges of pairs of electrodes. Devices fabricated with coincident or close-to-coincident device topology can have stress concentrated at the edges and corners. If such a device is fabricated on substrates such as ceramic, there can be a lower thermal mismatch with the platinum electrode, but high cost of manufacture and processing. However, this topology has been seen to be problematic on Si substrates with a conventional initial oxide of SiO$_2$. Coincident electrode edge device topology with conventional SiO$_2$ oxide on a Si substrate has been seen to result in catastrophic cracking of the conventional oxide, which is the layer with the lowest TEC.

The cracking problem can be addressed by using or otherwise forming of an initial oxide with higher TEC. There can be a limited choice of materials suitable for the role of initial oxide in a process flow with the particular anneal ranges seen for manufacturing these devices, such as anneal temperatures in the range of 600-1000 C or other temperature ranges. In one or more embodiments, the TEC of an SiO$_2$ initial oxide is modified (via reaction from a modifier layer) without changing the chemistry or adhesion at the interface to the bottom electrode of the device.

One or more of the exemplary embodiments is a method that includes compensating for a Thermal Expansion Coefficient mismatch for a silicon substrate of a device. The method can include providing a first silicon dioxide layer on the silicon substrate; depositing a modifier layer on the first silicon dioxide layer; depositing a second silicon dioxide layer on the modifier layer to form a multilayer initial oxide; and annealing the multilayer initial oxide resulting in an annealed multilayer initial oxide, wherein the annealing causes the alkali or alkali earth metals to chemically react at the interfaces between the modifier layer and the SiO$_2$ to form alkali or alkali earth silicates which will further melt with the SiO$_2$ layer and form more alkali or alkali earth silicates with a higher TEC extending a short way into the SiO$_2$ layers.

One or more of the exemplary embodiments is a method that includes fabricating a capacitor. The method includes providing a first silicon dioxide layer on a substrate; depositing a modifier layer on the first silicon dioxide layer, where the modifier layer comprises a group one metal or a group two metal; depositing a second silicon dioxide layer on the modifier layer to form a multilayer initial oxide; annealing the multilayer initial oxide resulting in an annealed multilayer initial oxide, where the annealing causes reaction of atoms or ions from the modifier layer into the first and second silicon dioxide layers and results in amorphous alkali or alkali earth silicates; depositing a first electrode layer on the annealed multilayer initial oxide; depositing a dielectric layer on the first electrode layer; depositing a second electrode layer on the dielectric layer, wherein an edge alignment spacing between at least one pair of corresponding electrode edges of two electrode layers of the capacitor is two microns or less; and providing connections for the first and second electrode layers.

One or more of the exemplary embodiments includes a silicon substrate; a multilayer initial oxide on the silicon substrate, where the multilayer initial oxide comprises amorphous polysilicates and comprises one of Lithium Niobate, Lead Lanthanum Zirconate Titanate, Lead Zirconate Titanate, Barium Titanate, Strontium Titanate, or Barium Strontium Titanate; a first electrode layer on the multilayer initial oxide; a dielectric layer on the first electrode layer; a second electrode layer on the dielectric layer, where an edge alignment spacing between at least one pair of corresponding electrode edges of two electrode layers of the capacitor is two microns or less; and connections for the first and second electrode layers. In one or more embodiments, the use of more than two dielectric layers in the capacitor can be provided because the TEC mismatch stress is reduced enough for such a configuration.

In one or more embodiments, the annealed multilayer initial oxide can be used in conjunction with an adhesion layer having a polar dielectric. The exemplary embodiments described herein can be used with or otherwise can include one or more features (e.g., in addition to and/or in place of feature(s) of the exemplary embodiments) described in U.S. application Ser. No. 15/901,498 entitled "METHOD AND APPARATUS FOR A THIN FILM DIELECTRIC STACK" having filed contemporaneously herewith (which application claims the benefit of U.S. Provisional Application No. 62/464,168, filed Feb. 27, 2017), the disclosure of all of which is hereby incorporated by reference herein.

In one or more embodiments, various techniques and elements (including techniques and elements after the providing of the annealed multilayer initial oxide and/or the adhesion layer) can be used to form one or more of the elements of the device. The exemplary embodiments described herein can be used with or otherwise can include one or more features (e.g., in addition to and/or in place of feature(s) of the exemplary embodiments) described in U.S. application Ser. No. 15/791,177 entitled "SMALL-GAP COPLANAR TUNABLE CAPACITORS AND METHODS FOR MANUFACTURING THEREOF" filed Oct. 23, 2017, the disclosure of all of which is hereby incorporated by reference herein.

In one or more embodiments, various techniques and elements (including techniques and elements after the providing of the annealed multilayer initial oxide and/or the adhesion layer) can be used to form one or more of the elements of the device. The exemplary embodiments described herein can be used with or otherwise can include one or more features (e.g., in addition to and/or in place of feature(s) of the exemplary embodiments) described in U.S. application Ser. No. 15/791,176 entitled "TUNABLE COPLANAR CAPACITOR WITH VERTICAL TUNING AND LATERAL RF PATTI AND METHODS FOR MANUFACTURING THEREOF" filed Oct. 23, 2017, the disclosure of all of which is hereby incorporated by reference herein.

Referring to FIG. 1A, a focused ion beam image of a portion of a device 100 is shown. Device 100 is a stacked dielectric device that includes electrode layers 114, 118, 119, dielectric layers 113, a silicon substrate 120, an adhesion layer 130, and a field oxide 150 which is an $SiO_2$ layer. The dielectric layers 113 are BST. The electrode layers 114, 118, 119 are platinum.

The adhesion layer 130 is a thin layer, such as about 200 A thick. The adhesion layer 130 is deposited as a single layer of BST (e.g., a polar dielectric adhesion layer). In one or more embodiments, the adhesion layer 130 due to the configuration of the adhesion layer on the $SiO_2$ and platinum electrode will include TiOx in the dielectric. Ti and Ta are metals so they are weakly adhering to $SiO_2$, and fairly adhering to Pt lower electrode. TiOx and TaOx are oxides of low polarity (e.g., slightly polarized covalent bonds). They will fairly adhere to $SiO_2$ but poorly adhere to Pt. Barium Tantalate or Barium Titanate and other alkali-earth titanates or tantalates are polar like BST. The chemical bonding is partly ionic partly polar covalent. They will adhere to both Pt and $SiO_2$ like BST.

A field oxide crack and delamination 199 is illustrated. The image of FIG. 1A is showing that the delamination of tunable devices on the Si substrate is starting from the crack in the initial oxide (i.e., the $SiO_2$ layer 150). There is no evident delamination between the $SiO_2$ layer 150, the adhesion layer 130, and the electrode 114. The adhesion layer 130 is appropriately adhering to both the $SiO_2$ and the Pt of layers 150, 114. If the adhesion layer 130 were not sufficient, the stack stress would be relieved by delamination of the adhesion layer from the $SiO_2$ layer 150 or the Pt layer 114 from the adhesion layer and there would be no $SiO_2$ cracking. FIG. 1A illustrates the crack in $SiO_2$ 150 which is the layer with the lowest TEC carrying all the stack stress.

FIG. 1A also illustrates an edge alignment gap or spacing (e.g., EAG1, EAG2, EAG3) between corresponding electrode edges which include a spacing of around 2 microns for EAG2, EAG3 and around three microns for EAG1. In one or more embodiments, one, some or all of the EAGs is reduced such as 2 microns or less or coincident (which can be no gap or can include a gap of 0.4 microns or less). The reduction of the EAG can improve device performance.

Figure 1B:
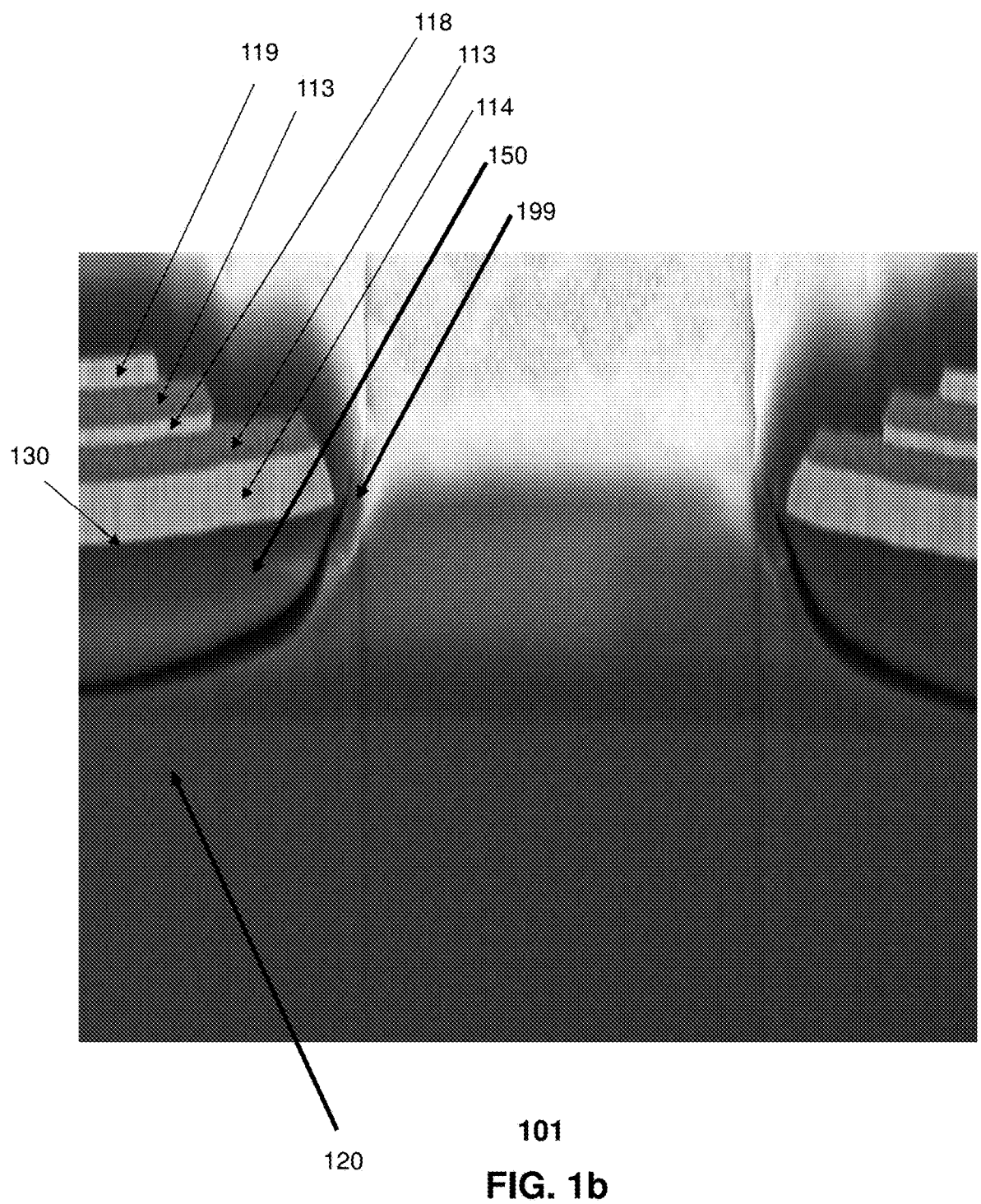

Referring to FIG. 1B, a focused ion beam image of a portion of a device 101 is shown. Device 101 is a stacked dielectric device that includes electrode layers 114, 118, 119, dielectric layers 113, a silicon substrate 120, an adhesion layer 130, and a field oxide 150 which is an $SiO_2$ layer. The dielectric layers 113 are BST. The electrode layers 114, 118, 119 are platinum.

The adhesion layer 130 is a thin layer, such as about 200 A thick. The adhesion layer 130 is deposited as a single layer of BST (e.g., a polar dielectric adhesion layer). In one or more embodiments, the adhesion layer 130 due to the configuration of the adhesion layer on the $SiO_2$ and platinum electrode will include TiOx in the dielectric. A field oxide crack and delamination 199 is illustrated. The image of FIG. 1B is showing that the delamination of tunable devices on the Si substrate is starting from the crack in the initial oxide (i.e., the $SiO_2$ layer 150). There is no evident delamination between the $SiO_2$ layer 150, the adhesion layer 130, and the electrode 114. The adhesion layer 130 is appropriately adhering to both the $SiO_2$ and the Pt of layers 150, 114.

Referring to FIGS. 2A, 2B, 2C images of a portion of a devices 200, 201, 202 are shown. Each of the devices 200, 201, 202 has an adhesion layer with a polar dielectric (BST in this example). Device 200 utilizes an Si substrate with a silicon dioxide layer and shows delamination 299, such as of multiple structures including tunable dielectric capacitor. Device 201 utilizes an Si substrate with a silicon dioxide layer and shows delamination 299 in the form of full stack delamination along with partial BST2/ETD2/ETD3 delamination. Device 203 has a ceramic substrate with a silicon dioxide layer and shows no delamination of devices including large area devices.

Figure 3A:
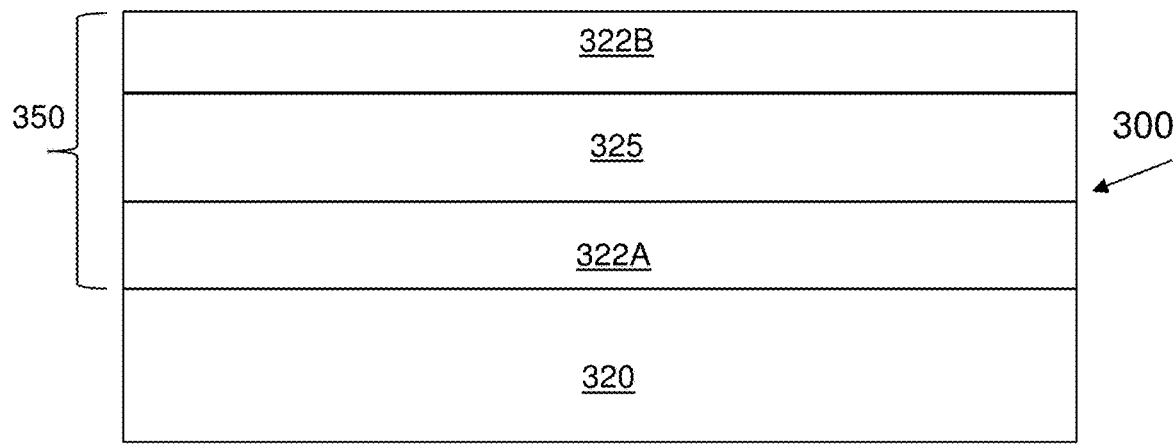
FIGS. 3A, 3B, 3C illustrate an exemplary embodiment of a modified oxide.
Figure 3B:
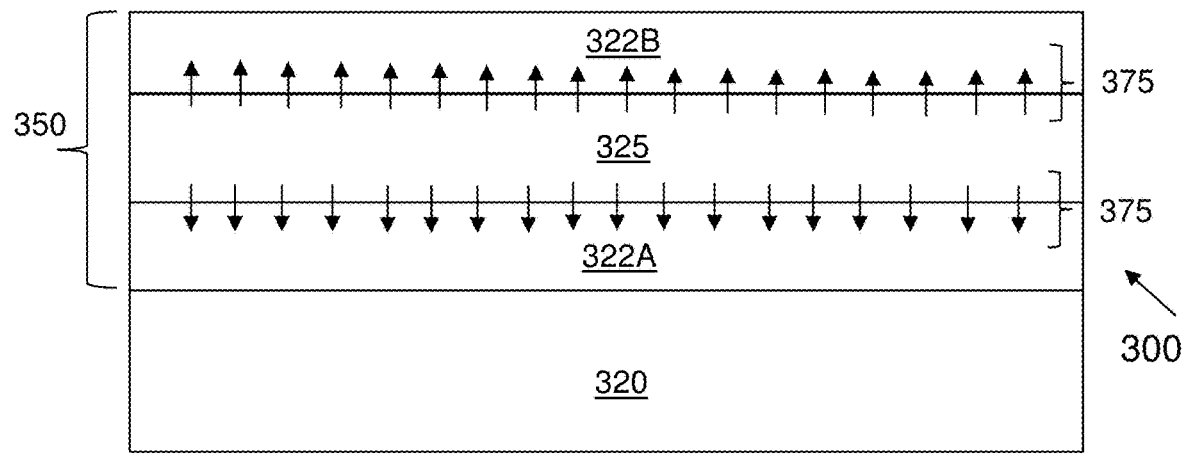
Figure 3C:
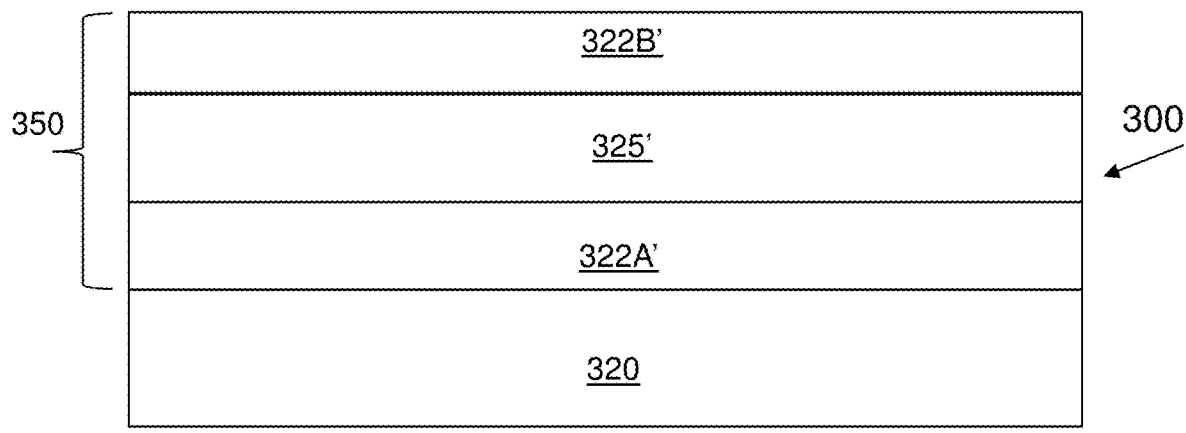

Referring to FIGS. 3A, 3B, 3C, an illustration of a portion of a device 300 is shown which provides for compensation for a TEC mismatch for a silicon substrate 320 of the device. The device 300 can be various types of devices such as a tunable dielectric capacitor. FIG. 3A represents the portion of the device after a multilayer initial oxide 350 has been deposited or otherwise formed on the silicon substrate 320 but before annealing. The multilayer initial oxide 350 includes a first silicon dioxide layer 322A directly on the silicon substrate, a modifier layer 325 directly on the first silicon dioxide layer, and a second silicon dioxide layer 322B directly on the modifier layer.

In one or more embodiments, the first and second silicon dioxide layers 322A, 322B can be pure silicon dioxide which can be amorphous, mono-crystalline, crystalline, and so forth. The modifier layer 325 is selected to include a material so that after annealing, modifier species or ions diffuse into the silicon dioxide layers 322A, 322B resulting in amorphous polysilicates. For example, the modifier layer 325 can include a group one or group two metal. In one embodiment, the modifier layer 325 can include Lithium Niobate (LNO), Lead Lanthanum Zirconate Titanate (PLZT), Lead Zirconate Titanate (PZT), Barium Titanate (BT), Strontium Titanate (ST), or BST.

FIG. 3B represents the portion of the device 300 during an annealing process of the multilayer initial oxide 350. The annealing causes the alkali or alkali earth metals to chemically react at the interfaces between the modifier layer and the $SiO_2$ to form alkali or alkali earth silicates from the modifier layer 325 which will further melt with the $SiO_2$ layers 322A, 322B and form more alkali or alkali earth silicates with a higher TEC extending a short way 375 into the $SiO_2$ layers.

FIG. 3C represents the portion of the device 300 after the annealing and the diffusion of the modifier species or ions which results in the amorphous alkali or alkali earth silicate layers 322A', 322B' formed from the modifier layer 325'. In one embodiment, the minimum thickness of the $SiO_2$ layers can be determined by the reaction of the oxide modifiers. The $SiO_2$ layers can be selected to be thick enough to prevent the modifier species, via reaction and melting, from reaching either the top or bottom interface of the $SiO_2$ layers (e.g., the interface with the Si substrate or the interface with an electrode layer or adhesion layer.

Pure $SiO_2$ (amorphous) has TEC of $0.55 \times 10^{-6}$ 1° C. at 300K. When modifiers are added, TEC can be increased. For background information for group one metals: Journal of Research of the National Bureau of Standards Vol. 57, No. 2, August 1956 Research paper 2698 Thermal Expansion of Binary Alkali Silicate Glasses Herman F. Shermer. For background information for group two metals: Stolyar, S. V., Tyurnina, N. G., Tyurnina, Z. G., and Doronina, L. A., Viscosity of Glass Melts in the SrO—$B_2O_3$—$SiO_2$ System, *Fiz. Khim. Stekla,* 2008, vol. 34, no. 4, pp. 662-664 [*Glass Phys. Chem.* (Engl. transl.), 2008, vol. 34, no. 4, pp. 509-511]; Betzen, A. R., Kudlacek, B. L., Kapoor, S., Berryman, J. R., Lower, N. P., Feller, H. A., and Affatigato, M., Physical Properties of Barium Borosilicate Glasses Related to Atomic Structure, *Phys. Chem. Glasses,* 2003, vol. 44, no. 3, pp. 207-211.

In one or more embodiments, properties of $SiO_2$ based glasses (including TEC) can change by adding modifiers. For background information for glasses: The Structure of Silicate Glasses and Melts Grant S. Henderson, Georges Calas, and Jonathan F. Stebbins ELEMENTS, October 2006, Vol. 2, pp. 269-273. Various materials (e.g., $SiO_2$) can be affected in structure and properties, including materials having chemical complexity. Network-modifying cations can have effect on structure and properties which may be shown at least by utilizing alkali and alkaline earth elements. Aluminum, iron, titanium, and phosphorus and others can have specific effects. For background information: Silicate Glasses and Melts: Properties and Structure, Bjorn, Mysen, Pascal, and Richet, Elsevier Science, 16 Jun. 2005; Thermal Expansion Calculation of Silicate Glasses at 210° C., Based on the Systematic Analysis of Global Databases, Alexander Fluegel, glassproperties.com, December 2007.

In one or more embodiments where device 300 is a tunable dielectric capacitor, the use of a silicon substrate 320 is at a much lower cost than ceramic substrates but increases the stress in the stack (which can result in structures delaminating from the field oxide and from the electrodes). In one or more embodiment, the $SiO_2$ layers 322A, 322B can be from 1,000 A to 20,000 A. In one or more embodiments, the thickness of modifier layer 325 is selected so that it is thick enough so that the TEC and Tg effects on the resulting annealed multilayer initial oxide are enough to prevent delamination. In one embodiment, the minimum thickness of the $SiO_2$ layers 322A, 322B are determined by the diffusion reaction and melting of the oxide modifiers (e.g., the group one or group two metal ions).

Figure 4:
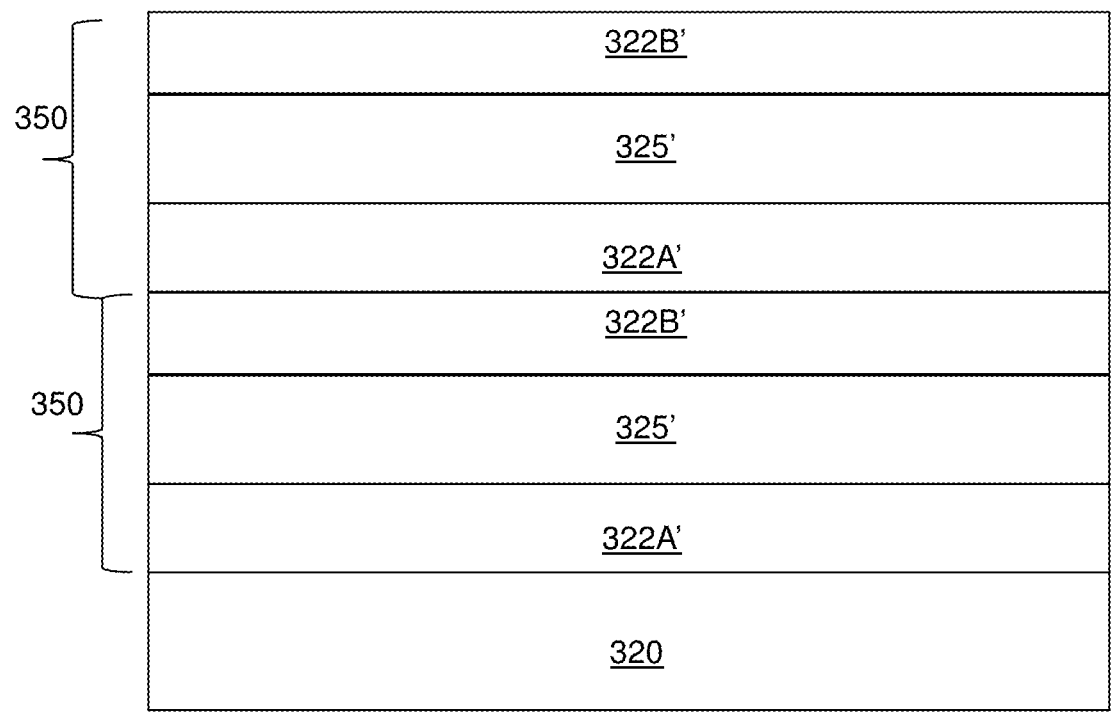
FIG. 4 illustrate an exemplary embodiment of a stacked modified oxide.

Referring to FIG. 4, an illustration of a portion of a device 400 is shown which provides for compensation for a TEC mismatch for a silicon substrate 320 of the device. The device can be various types of devices such as a tunable dielectric capacitor. FIG. 4 illustrates a stacked arrangement of multiple (only two shown but more can be utilized) annealed multilayer initial oxides which can be consecutively processed by deposition of silicon dioxide layer on a modifier layer deposited on a silicon dioxide layer disposed on a silicon substrate and an anneal. The modifier layers can be of a same material or can be of different materials. The annealing causes modifier species or ions to diffuse from the modifier into the silicon dioxide layers resulting in amorphous polysilicates. In one or more embodiments, the number of stacked annealed multilayer initial oxides 350 can be selected based on satisfying desired properties, such as compensation for TEC mismatch, smoothness, and so forth.

Figure 5A:
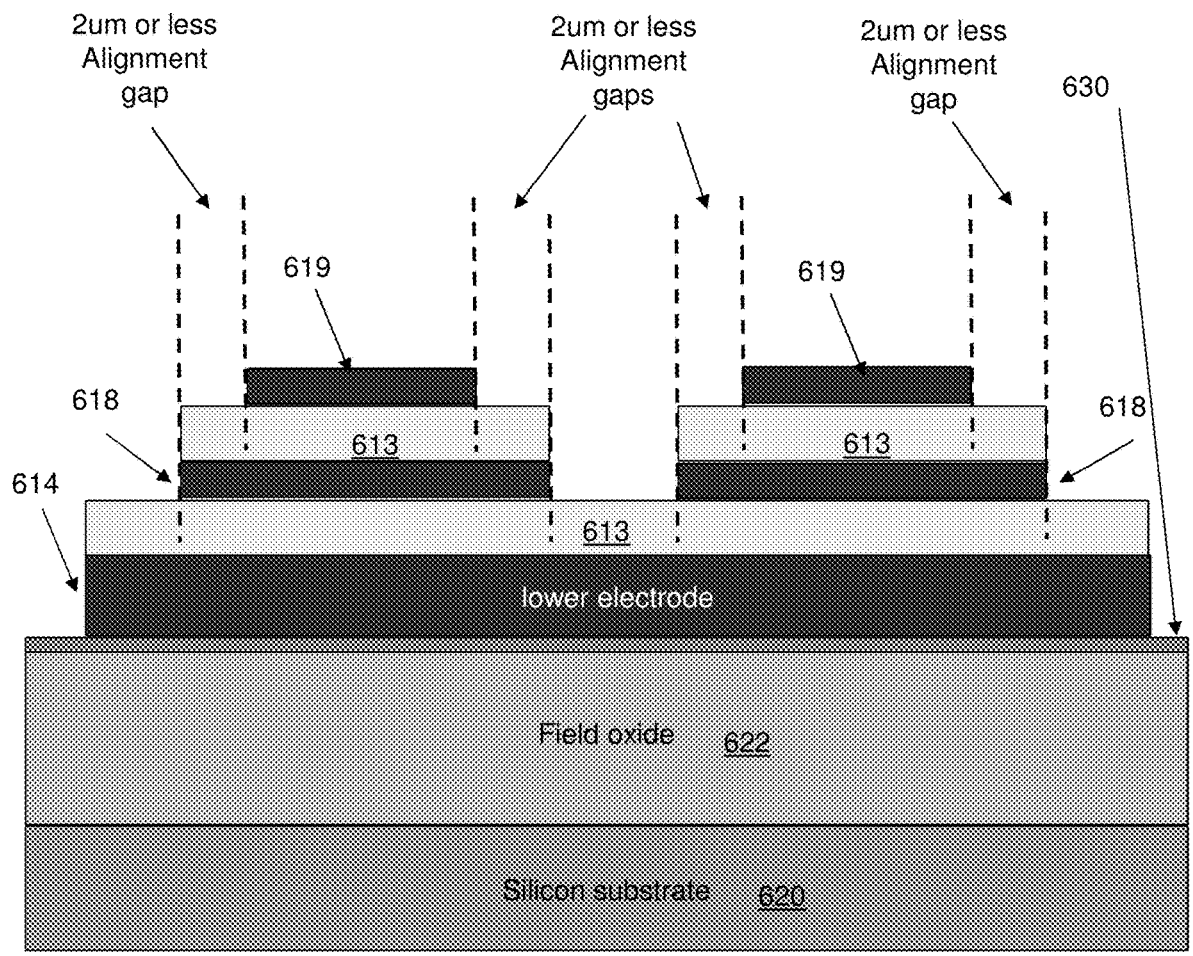
FIGS. 5A and 5B illustrate exemplary embodiments of thin film capacitors having multiple dielectric layers.

Referring to FIG. 5A, a portion of a device 500 is shown. Device 500 can be a stacked dielectric device that includes electrode layers 614, 618, 619, dielectric layers 613, a silicon substrate 620, an adhesion layer 630, and a field oxide 622. In one embodiment, the field oxide 622 can be an $SiO_2$ layer, although other field oxides can be utilized including an annealed multilayer modified oxide, and so forth. The adhesion layer 630 can include a polar dielectric.

In one embodiment, the polar dielectric adhesion layer 630 can be BST or can also be various other polar dielectric material(s) selected depending on the materials, fabrication techniques and performance parameters of the capacitor 500. In one embodiment, the adhesion layer 630 can be a single layer or a multilayer adhesion layer such as including a second (or more) adhesion layer(s) deposited on the first adhesion layer. As an example, the second adhesion layer can be a thin film of Ti, Ta, TiOx and TaOx. Other layers can also be included in the capacitor 500 such as a hermetic insulating layer ($Si_3N_4$).

In this illustration, the bottom capacitor (defined by the middle electrode 618) is larger than the top capacitor due to the edge alignment gap between electrodes 618, 619. The MESA-like structure means that the bottom capacitor has an uncompensated area where the top capacitor is absent. This can cause reduction of Q-factor and increase in harmonics decreasing capacitor performance. In one embodiment, the edge alignment gap can be made to be 2 microns or less.

Figure 5B:
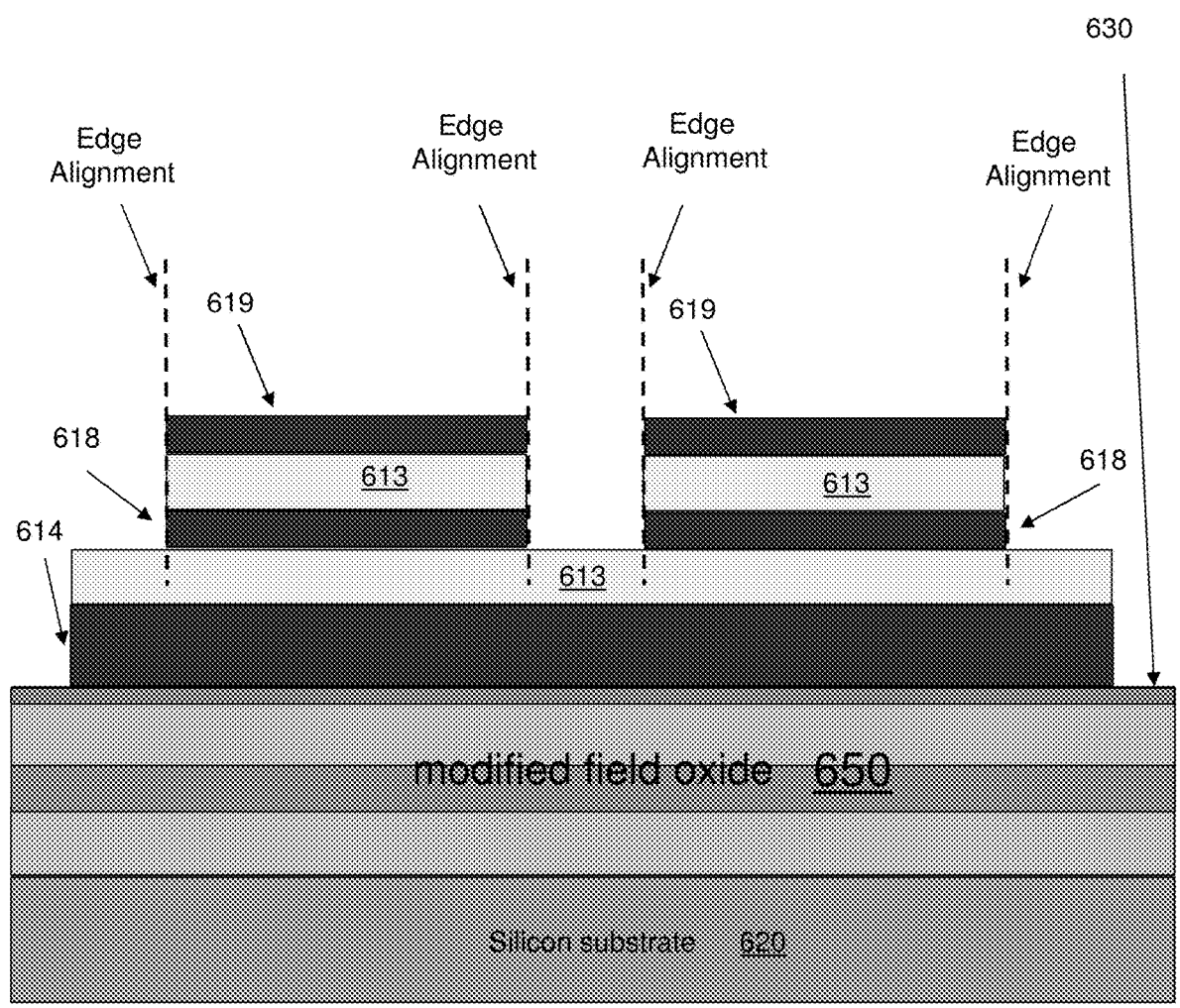

Referring to FIG. 5B, a portion of a device 501 is shown. Device 501 can be a stacked dielectric device that includes electrode layers 614, 618, 619, dielectric layers 613, a silicon substrate 620, an adhesion layer 630, and a modified field oxide 650. The modified field oxide 650 can be formed from the annealing processes described herein resulting in amorphous polysilicates (e.g., annealed multilayer initial oxide 350). The adhesion layer 630 can include a polar dielectric, can be a single layer, and/or can be a multilayer adhesion layer that includes another adhesion layer(s) such as a thin film of Ti, Ta, TiOx and TaOx. Other layers can also be included in the capacitor 501 such as a hermetic insulating layer ($Si_3N_4$).

In one or more embodiments, device 501 provides top and bottom capacitors that are of the same or substantially same lateral dimensions (such as 0.8 or less micron difference or 0.4 or less micron difference or 0.2 or less micron difference) for electrostrictive resonance cancellation and for linearity.

The edge alignment can be coincident edges (which can be no gap or can include an edge alignment gap or spacing of 0.4 microns or less) of the electrodes 618, 619 so as to provide a coincident-like structure of device 501 meaning that the bottom capacitor does not or substantially does not have an uncompensated area where the top capacitor is absent and therefore reduction of Q-factor and increase in harmonics is avoided or otherwise mitigated.

In one embodiment, the $SiO_2$ layers of the modified field oxide 650 can be from 1,000 A to 20,000 A while the modifier layer is thick enough so that the TEC and Tg effects on the field oxide are enough to prevent delamination. In one embodiment, the thickness of the $SiO_2$ layers of the modified field oxide 650 are thick enough to prevent the modifier species, during reaction and melting resulting from annealing, from reaching either the top or bottom interface.

The use of the coincident-like structure can increase or otherwise concentrate stress at the edges of the structure.

However, the modified field oxide 650 can compensate for TEC mismatch and prevent delamination.

In one or more embodiment, the coincident edges (which can be no gap or can include 0.4 microns or less spacing) can be formed by etching through electrode layers on a first etch and then patterning the capacitor contact areas separately. In one or more embodiments, unconnected Pt layers can be utilized to give thicker dielectric layers for high-voltage/high-power applications.

Figure 6A:
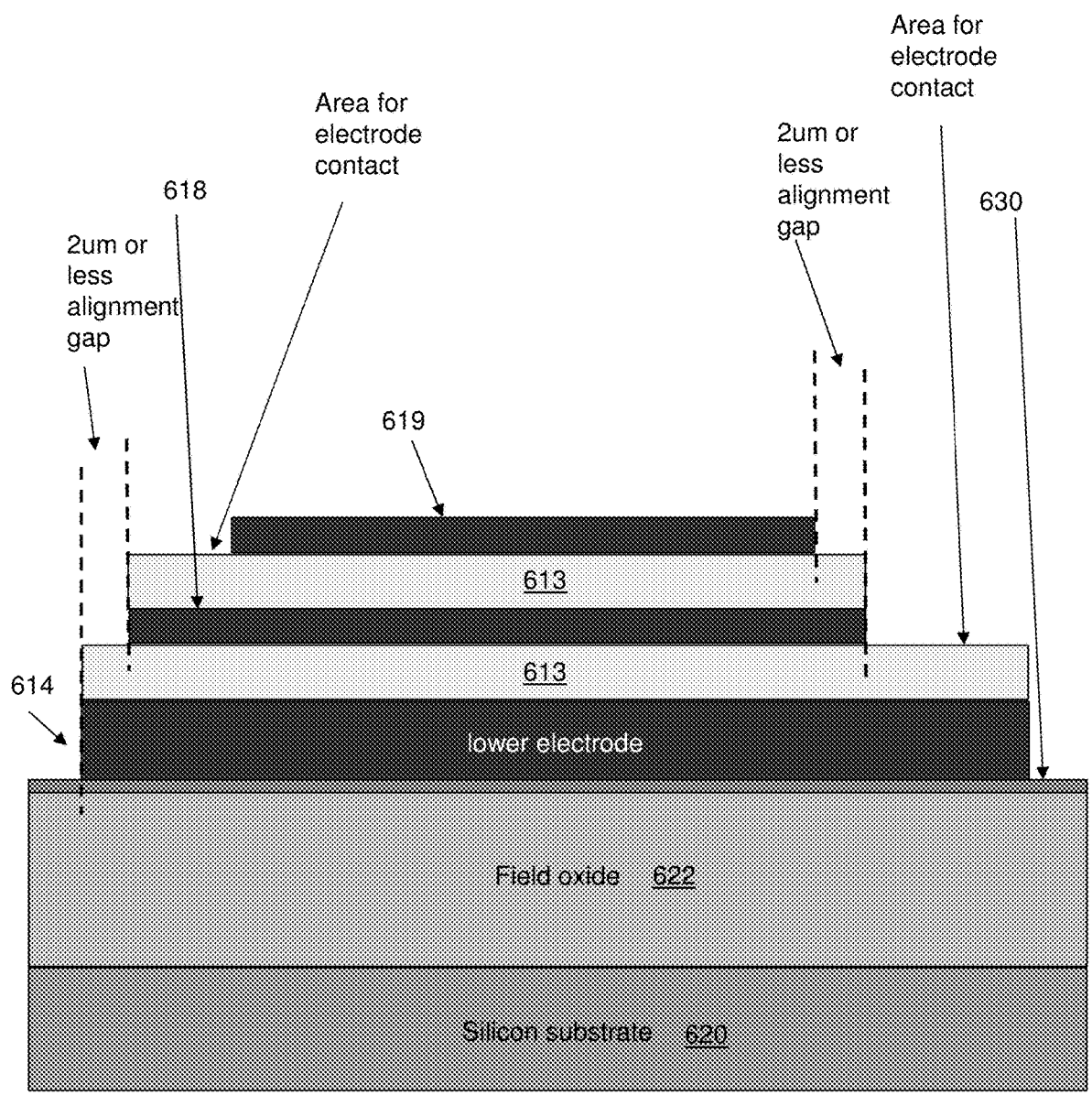
FIGS. 6A and 6B illustrate exemplary embodiments of thin film capacitors having multiple dielectric layers.

Referring to FIG. 6A, a portion of a device 600 is shown. Device 600 can be a stacked dielectric device that includes electrode layers 614, 618, 619, dielectric layers 613, a silicon substrate 620, an adhesion layer 630, and a field oxide 622. In one embodiment, the field oxide 622 can be an $SiO_2$ layer, although other field oxides can be utilized including an annealed multilayer modified oxide, and so forth. The adhesion layer 630 can include a polar dielectric.

In one embodiment, the polar dielectric adhesion layer 630 can be BST or can also be various other polar dielectric material(s) selected depending on the materials, fabrication techniques and performance parameters of the capacitor 600. In one embodiment, the adhesion layer 630 can be a single layer or a multilayer adhesion layer such as including a second (or more) adhesion layer(s) deposited on the first adhesion layer. As an example, the second adhesion layer can be a thin film of Ti, Ta, TiOx and TaOx. Other layers can also be included in the capacitor 600 such as a hermetic insulating layer ($Si_3N_4$).

The device 600 includes areas for electrode contacts but also includes alignment gaps. Due to the alignment gaps, the bottom capacitor (defined by the middle electrode 618) is larger than the top capacitor. The MESA-like structure means that the bottom capacitor has uncompensated areas where the top capacitor is absent. This can cause reduction of Q-factor and increase in harmonics decreasing capacitor performance. In one embodiment, the edge alignment gap can be made to be 2 microns or less.

Figure 6B:
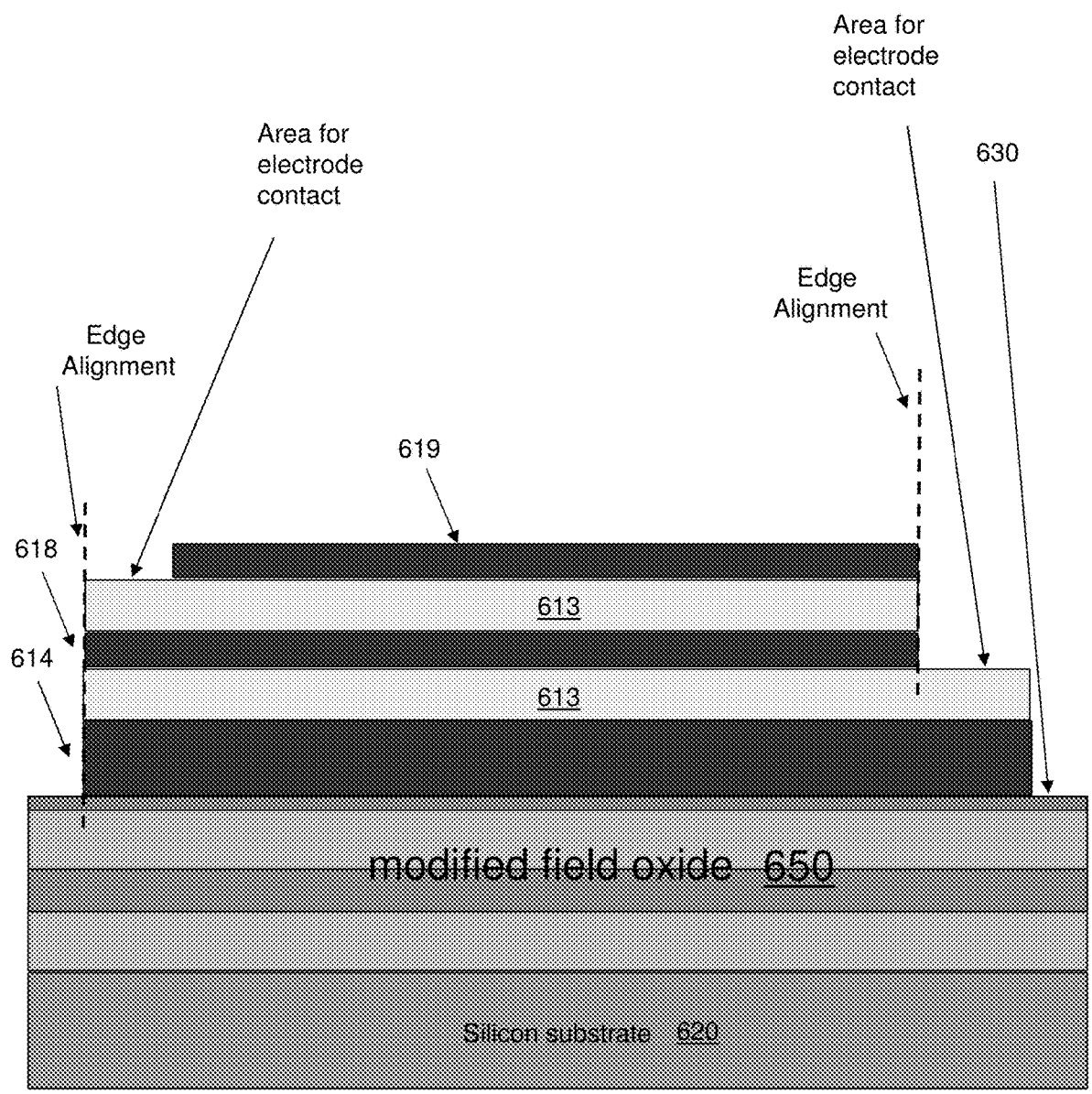

Referring to FIG. 6B, a portion of a device 601 is shown. Device 601 can be a stacked dielectric device that includes electrode layers 614, 618, 619, dielectric layers 613, a silicon substrate 620, an adhesion layer 630, and a modified field oxide 650. The modified field oxide 650 can be formed from the annealing processes described herein resulting in amorphous polysilicates (e.g., annealed multilayer initial oxide 350). The adhesion layer 630 can include a polar dielectric, can be a single layer, and/or can be a multilayer adhesion layer that includes another adhesion layer(s) such as a thin film of Ti, Ta, TiOx and TaOx. Other layers can also be included in the capacitor 601 such as a hermetic insulating layer ($Si_3N_4$).

In one or more embodiments, device 601 provides top and bottom capacitors that are of the same or substantially same lateral dimensions (such as 0.2 or less micron difference) for electrostrictive resonance cancellation and for linearity.

The edge alignment can be coincident edges (which can be no gap or can include an edge alignment gap or spacing of 0.4 microns or less) of the electrodes 614, 618 and 618, 619 so as to provide a coincident-like structure of device 601 meaning that the bottom capacitor does not or substantially does not have an uncompensated area where the top capacitor is absent and therefore reduction of Q-factor and increase in harmonics is avoided or otherwise mitigated.

In one embodiment, the $SiO_2$ layers of the modified field oxide 650 can be from 1,000 A to 20,000 A while the modifier layer is thick enough so that the TEC and Tg effects on the field oxide are enough to prevent delamination. In one embodiment, the thickness of the $SiO_2$ layers of the modified field oxide 650 are thick enough to prevent the modifier species, during reaction and melting resulting from annealing, from reaching either the top or bottom interface.

The use of the coincident-like structure can increase or otherwise concentrate stress at the edges of the structure. However, the modified field oxide 650 can compensate for TEC mismatch and prevent delamination.

In one or more embodiment, the coincident edges (which can be no gap or can include 0.4 microns or less spacing) can be formed by etching through electrode layers on a first etch and then patterning the capacitors separately. In one or more embodiments, unconnected Pt layers can be utilized for thicker layers for high-voltage/high-power applications.

Figure 7:
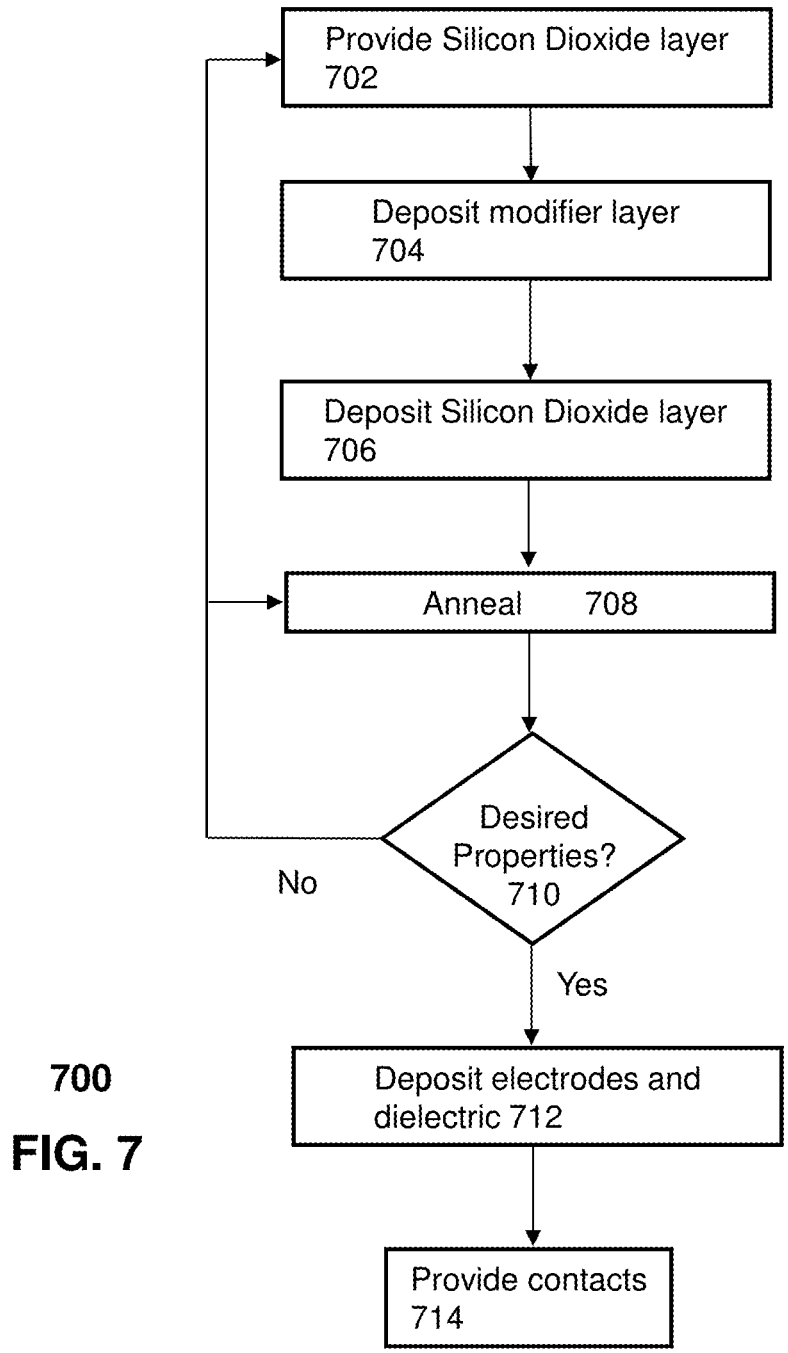
FIG. 7 illustrates an exemplary embodiment of a method of fabricating a thin film capacitor.

FIG. 7 depicts an illustrative method 700 for compensation for a Thermal Expansion Coefficient mismatch for a silicon substrate of a device such as during fabricating a multilayer capacitor structure. In one embodiment, the device can be a tunable capacitor or other device that is subject to TEC mismatch, such as with the substrate of the device. Method 700 can be utilized for other devices including fixed capacitors.

At 702, a first silicon dioxide layer can be provided on the silicon substrate. In one embodiment, the providing the first silicon dioxide layer can be done by various techniques such as thermal oxidation or a deposition process such as low pressure chemical vapor deposition, atmospheric pressure chemical vapor deposition, tetraethyl orthosilicate deposition, or a combination thereof.

At 704, a modifier layer can be deposited on the first silicon dioxide layer. In one embodiment, the depositing of the modifier layer can be done various techniques such as a deposition process such as chemical vapor deposition, spin-on of metal-organic precursor, or sputtering. In one embodiment, the modifier layer can include a material having a group one metal or a group two metal. For example, the modifier layer can include LNO, PLZT, PZT, BT, ST, or BST.

At 706, a second silicon dioxide layer can be deposited on the modifier layer to form a multilayer initial oxide. In one embodiment, the depositing the second silicon dioxide layer can be by various techniques including a deposition process such as low pressure chemical vapor deposition, atmospheric pressure chemical vapor deposition, tetraethyl orthosilicate deposition, or a combination thereof.

At 708, the multilayer initial oxide can be annealed resulting in an annealed multilayer initial oxide. The annealing can cause the alkali or alkali earth metals to chemically react at the interfaces between the modifier layer and the $SiO_2$ to form alkali or alkali earth silicates from the modifier layer 325 which will further melt with the $SiO_2$ layers 322A, 322B and form more alkali or alkali earth silicates with a higher TEC extending a short way into the $SiO_2$ layers. The annealing can be performed at various temperatures based on various factors such as the properties of the modifier layer being utilized. For example, the annealing can be at a temperature between 950-1100 C, although other annealing temperatures can be utilized.

At 710, a determination can be made as to whether the annealed multilayer initial oxide has desired properties such as TEC, smoothness and so forth. In one embodiment, additional annealing can be performed. In another embodiment, the annealed multilayer initial oxide process can be repeated resulting in two or more stacked annealed multilayer initial oxide. For example, the annealed multilayer initial oxide described above can be a first annealed multilayer initial oxide and steps 702, 704, 706, 708 and/or 710 can be repeated such as by depositing a third silicon dioxide layer on the first annealed multilayer initial oxide; depositing a second modifier layer on the third silicon dioxide layer; depositing a fourth silicon dioxide layer on the second modifier layer to form a second multilayer initial oxide; and performing a second annealing of the second multilayer initial oxide resulting in a second annealed multilayer initial oxide on the first annealed multilayer initial oxide, where the second annealing causes the alkali or alkali earth metals to chemically react at the interfaces of the second modifier layer with the third and fourth silicon dioxide layers and form alkali or alkali earth silicates which will further melt with and extend a short way into the third and fourth silicon dioxide layers.

In one embodiment, various other steps can be performed for forming the particular device. For example at 712, electrode layers of conductive material and dielectric layer(s) can be deposited or otherwise provided for the device. For instance, a first electrode layer can be deposited on the annealed multilayer initial oxide; a dielectric layer can be deposited on the first electrode layer; a second electrode layer can be deposited on the dielectric layer; and at 714 connections can be provided such as for the first and second electrode layers (or other elements). The electrode layers and dielectric layers can be formed of various materials as described herein. In one embodiment, the modifier layer and the dielectric layer can be a same material and/or can be deposited utilizing a same technique.

In one embodiment, an edge alignment gap or spacing between at least one pair of corresponding electrode edges of two electrode layers of the device can be two microns or less. In one embodiment, an edge alignment gap or spacing between at least one pair of corresponding electrode edges of two electrode layers of the device can be 0.4 microns or less. The edge alignment gap can be maintained within the desired dimensions through various processes including etching.

In one embodiment, an adhesion layer(s) can be utilized between the annealed multilayer initial oxide and the first electrode layer. The particular type of adhesion layer can vary as is described herein. For example, an adhesion layer can be deposited on the annealed multilayer initial oxide, where the adhesion layer comprises a polar dielectric; a first electrode layer can be deposited on the adhesion layer; a dielectric layer can be deposited on the first electrode layer; and a second electrode layer can be deposited on the dielectric layer.

In one embodiment, polar dielectrics are those in which the possibility of center coinciding of the positive as well as negative charge is almost zero. Polar dielectrics can have an asymmetric shape. In one embodiment, non-polar dielectrics are those in which the centers of both positive as well as negative charges coincide. The dipole moment of each molecule in a non-polar can be zero and can be symmetric in shape.

In one embodiment, the depositing of electrode layer(s) can be by sputtering or chemical vapor deposition. In one embodiment, the depositing the dielectric layer(s) can be by sputtering, chemical vapor deposition, spin-on deposition, misted deposition, or a combination thereof.

In one embodiment, any number of anneals can be performed on the multilayer initial oxide which can be performed utilizing a temperature that is ramped up and down with a plateau at high temperature. In one or more embodiments the glass transition temperature of the modifier layer is lower than of pure $SiO_2$ that can be utilized in the $SiO_2$ layers.

In one embodiment, the depositing of the silicon dioxide layer(s) and modifier layer can be repeated (any number of times) in a stacked arrangement (prior to deposition of a lower electrode layer) until a desired increase of TEC is achieved and/or in order to achieve a desired quality of the layer (e.g., smoothness).

In one embodiment, the stacked arrangement of annealed multilayer initial oxides can be obtained by repeating the deposition of a silicon dioxide layer, the deposition of the modifier layer, and the deposition of another silicon dioxide layer on the previously formed annealed multilayer initial oxide. In another embodiment, the stacked arrangement of annealed multilayer initial oxides can be obtained by deposition of another modifier layer directly on the previously formed annealed multilayer initial oxide and the deposition of another silicon dioxide layer on the other modifier layer followed by another annealing. In one or more embodiments utilizing a stacked arrangement of annealed multilayer initial oxides embodiments, each of the modifier layers can be of a same material, a different material, or some same and some different material (e.g., first and third modifier layers are a first material and second and fourth modifier layers are a second material).

Figure 8:
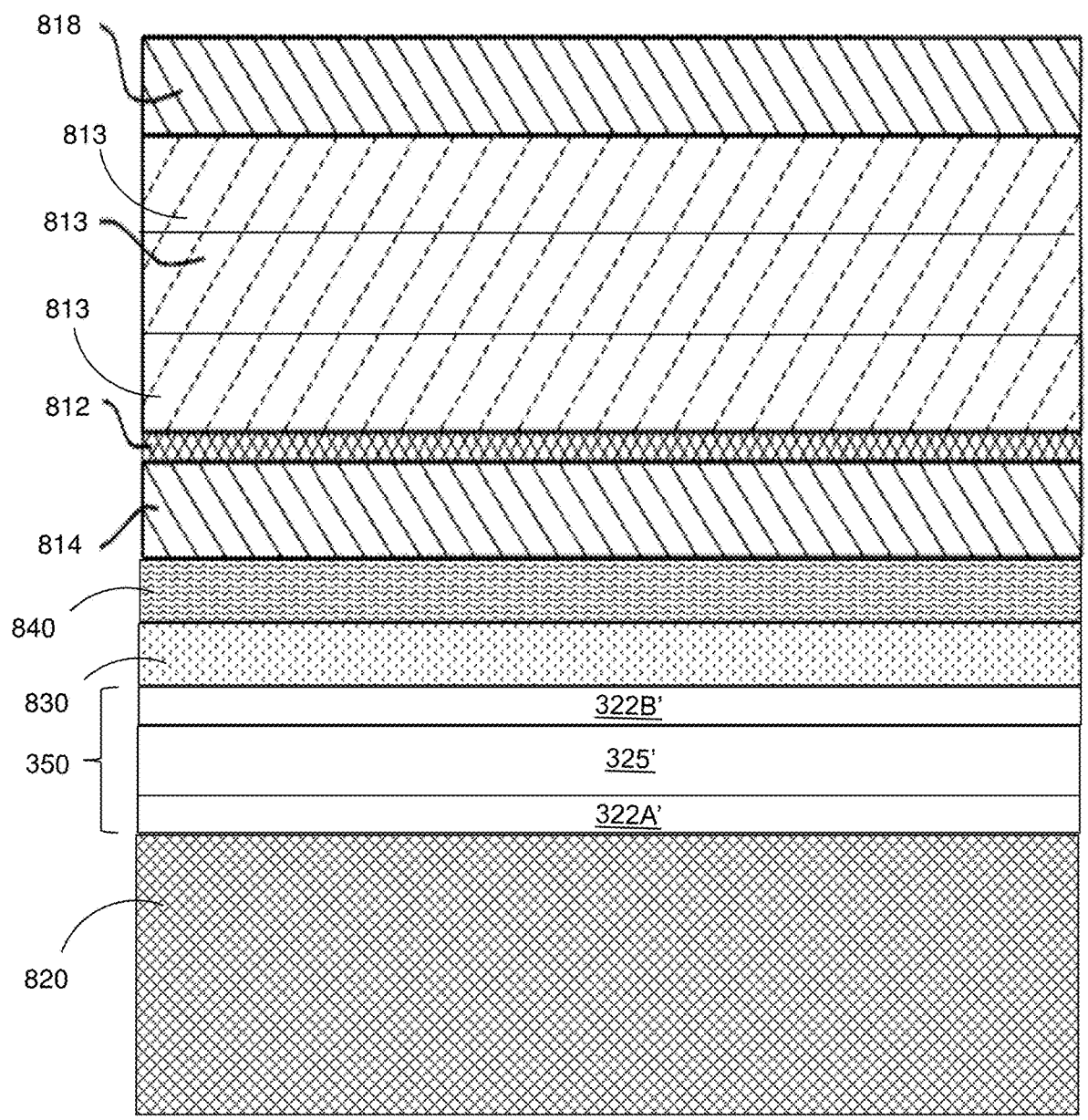
FIG. 8 illustrates another exemplary embodiment of a thin film capacitor having multiple dielectric layers.

Referring to FIG. 8, a capacitor 800 is illustrated that utilizes an annealed multilayer initial oxide 350 to compensate for TEC mismatch and utilizes a polar dielectric adhesion layer 830, and which can also improve time-dependent dielectric breakdown. Capacitor 800 includes the annealed multilayer initial oxide 350 being utilized in conjunction with a double adhesion layer 830, 840, and a multilayer dielectric 812, 813. The exemplary embodiments can include any combination of the features described with respect to capacitor 800 such as the annealed multilayer initial oxide 350 (or a stacked annealed multilayer initial oxide) being utilized alone or in conjunction with a single (e.g., layer 830) or multilayer adhesion layer (e.g., layers 830, 840), and a single dielectric (e.g., dielectric 813).

In one or more embodiments, electrodes 814, 818 can be utilized which are formed of various materials including platinum, platinum alloy, iridium either solely or in combination with iridium oxide, ruthenium oxide, or Strontium Ruthenium Oxide (SRO), any metal or conductive oxide or any combination of these materials. The electrodes 814, 818 can be formed from other conductive materials, including non-metal conductive materials. The electrodes 814, 818 can be formed from the same material or can be formed from different materials. In one or more embodiments, the electrodes 814, 818 can be a conductive layer comprised of metals, conductive oxides or a combination thereof while the dielectric layer is comprised of a high K dielectric material.

In one or more embodiments, the capacitor structure which may have multiple dielectric layers 812, 813 (or a single dielectric layer) can be formed utilizing a silicon substrate 820. The annealed multilayer initial oxide 350 (or a stacked arrangement of such modified field oxides) can be on the substrate 820. In this example, a first polar dielectric adhesion layer 830 can be deposited on the annealed multilayer initial oxide 350. The first polar dielectric adhesion layer 830 can also be various other polar dielectric material(s) selected depending on the materials, fabrication techniques and performance parameters of the capacitor 800. In one embodiment, a second (or more) adhesion layer(s) 840 can be deposited on the first adhesion layer 830, although a single polar dielectric adhesion layer could also be utilized. As an example, the second adhesion layer can be a thin film of Ti, Ta, TiOx and TaOx. Other layers can also be included in the capacitor 800 such as a hermetic insulating layer (Si$_3$N$_4$).

The dielectric layers 812, 813 as described herein can be formed by a process, formed from material(s) and/or have particular crystal grain structures which provide desired properties to the capacitor 800, such as suppression of dendrite formation, suppression of hillock formation and/or improvement of time-dependent dielectric breakdown.

In a multi-layer dielectric embodiment, capacitor 800 can include the first dielectric layer 812, and one or more second dielectric layers 813 (three of which are shown), which can be formed directly on each other. The dielectric layers 812, 813 can be formed between the electrode layer 814 and the electrode layer 818.

In one or more embodiments, the dielectric layers 812, 813 can be formed of the same or different materials including BST, Strontium Bismuth Tantalate (SBT), PZT, PLZT, any other perovskite or pyrochlore phase ferroelectric film, or a combination thereof.

In one or more embodiments, the first dielectric layer 812 can have a vertically-oriented columnar grain structure. In one or more embodiments, the second dielectric layers 813 can be a group of stacked dielectric layers (formed of a same or different materials) of a tunable high-K dielectric with randomly oriented grains. The selection of dielectric materials can be based on various factors including to improve or optimize one or more of material losses, capacitance-voltage (CV) response or curve, maximum capacitance tuning ratio, reliability and electrostrictive resonance cancellation.

In one embodiment, the thickness of the first dielectric layer 812 and/or the second dielectric layer(s) 813 can be selected so that they are thin enough to not adversely affect the operation of the capacitor 800 but thick enough to enable suppression of hillock formation, suppression of dendrite formation, and/or avoid or reduce charge trapping at the electrode-dielectric interface. As an example, the overall thickness of the dielectric layer(s) 812, 813 can be less than 800 A and the thickness of the first dielectric layer 812 can be the same or different from the thickness of one, some or all of the second dielectric layers 813. The thicknesses selected for the first dielectric layer 812 and/or second dielectric layer(s) can be based on various factors including one or more of the dielectric material(s) being utilized, the electrode material(s) being utilized, the desired properties of the capacitor, the desired size and/or shape of the capacitor, the operating environment of the capacitor, and so forth.

In one embodiment, the first adhesion layer 830 and the first and/or second dielectric layers 812, 813 can be formed of the same material. In another embodiment, the first adhesion layer 830 and the first and/or second dielectric layers 812, 813 can be formed of different materials.

Figure 9:
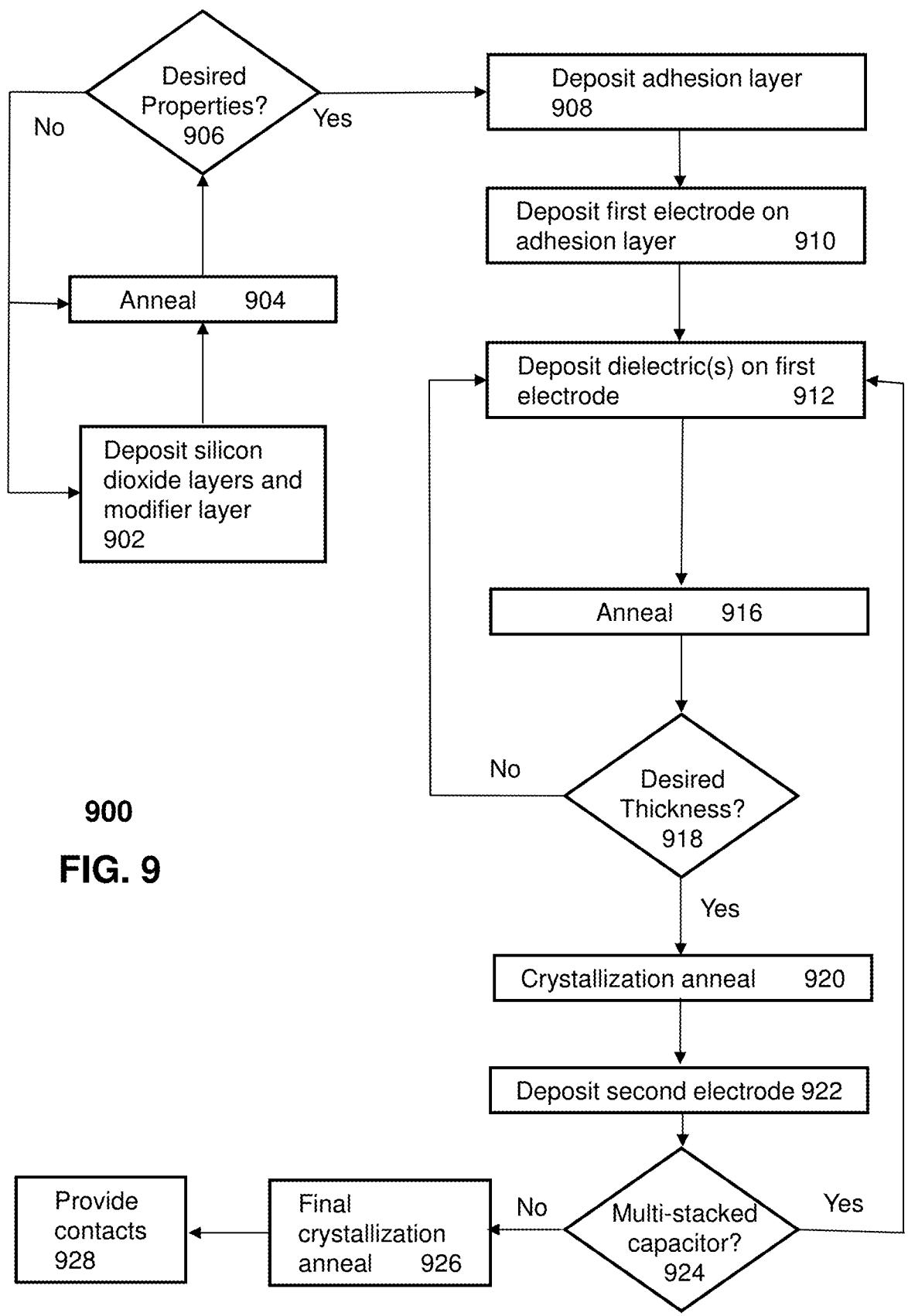
FIG. 9 illustrates an exemplary embodiment of a method of fabricating a thin film capacitor.

FIG. 9 depicts an illustrative method 900 for fabricating a device, such as a multilayer capacitor structure, utilizing a modified oxide layer. Method 900 is described with respect to forming the device (e.g., a tunable dielectric capacitor) that includes an annealed multilayer initial oxide (e.g. annealed multilayer initial oxide 350) being utilized in conjunction with an adhesion layer (e.g., layers 830 and/or 840), and dielectric(s) (e.g., dielectric layers 812 and/or 813). The method 900 of the exemplary embodiments can include all or some of the steps of FIG. 9 and can be rearranged or have other steps added thereto to provide for other embodiments of the process and device such as the annealed multilayer initial oxide 350 (or a stacked annealed multilayer initial oxide) being utilized alone or in conjunction with a single (e.g., layer 830) or multilayer adhesion layer (e.g., layers 830, 840), and a single dielectric (e.g., dielectric 813).

At 902, a first silicon dioxide layer can be provided on a silicon substrate; a modifier layer can be deposited on the first silicon dioxide layer; and a second silicon dioxide layer can be deposited on the modifier layer to form a multilayer initial oxide. Various techniques can be used for depositing one or both of the silicon dioxide layers such as thermal oxidation or a deposition process such as low pressure chemical vapor deposition, atmospheric pressure chemical vapor deposition, tetraethyl orthosilicate deposition, or a combination thereof. Various techniques can be used for depositing the modifier layer such as a deposition process such as chemical vapor deposition, spin-on of metal-organic precursor, or sputtering. The modifier layer can be selected such that when it is annealed it will provide for chemical reaction of the alkali or alkali earth metals with the silicon dioxide layer and result in alkali or alkali earth silicates extending and short way into the silicon dioxide layers. In one embodiment, the modifier layer can include a material having a group one metal or a group two metal. For example, the modifier layer can include LNO, PLZT, PZT, BT, ST, or BST.

At 904, the multilayer initial oxide can be annealed resulting in an annealed multilayer initial oxide. The annealing can cause a chemical reaction of the alkali or alkali earth metals with the first and second silicon dioxide layers and can result in alkali or alkali earth silicates extending a short way into the silicon dioxide layers. The annealing can be performed at various temperatures based on various factors such as the properties of the modifier layer being utilized. For example, the annealing can be at a temperature between 950-1100 C, although other annealing temperatures can be utilized.

At 906, a determination can be made as to whether the annealed multilayer initial oxide has desired properties such as TEC, smoothness and so forth. In one embodiment, additional annealing can be performed. In another embodiment, one or more steps forming the annealed multilayer initial oxide can be repeated resulting in two or more stacked annealed multilayer initial oxide.

At 908, an adhesion layer can be deposited on the annealed multilayer initial oxide of the silicon substrate, which can be one annealed multilayer initial oxide or a stacked arrangement of annealed multilayer initial oxides. The adhesion layer can be or can otherwise comprise a polar dielectric. In one embodiment, the adhesion layer is not any thin film of Ti, Ta, TiOx and TaOx. In one embodiment, the adhesion layer can be multiple adhesion layers deposited on each other, such as a first adhesion layer that is or otherwise comprises a polar dielectric and a second adhesion layer that is a thin film of Ti, Ta, TiOx and TaOx, where the second adhesion layer is deposited on the first adhesion layer, and where the first adhesion layer is deposited on the annealed multilayer initial oxide of the silicon substrate. At 910, a first electrode layer of conductive material may be deposited or otherwise formed on the adhesion layer.

At 912, one or more dielectric layers can be deposited or otherwise formed on the first electrode layer. For example, a multiple dielectric layer technique can be utilized where particular grain structures and deposition temperatures are employed to avoid undesired results such as Hillock formation. For example, a first dielectric layer of ferroelectric material (e.g., BST, SBT, BZN, PZT, PLZT, any other perovskite or pyrochlore phase ferroelectric film, or a combination thereof) can be deposited or otherwise formed on the first electrode layer. In one embodiment, the first dielectric layer can cover an entire top surface of the first electrode layer. In one or more embodiments, the first dielectric layer can have a thickness between 50 A and 500 A, although other thicknesses can be utilized, such as based on the type of dielectric material, the parameters for the capacitor being formed, and so forth. In one embodiment, the thickness of the first dielectric layer can be selected so that it is thin enough to not adversely affect the operation of the capacitor but thick enough to enable suppression of hillock formation and/or avoid or reduce charge trapping.

In one embodiment, the first dielectric layer can be a layer that suppresses formation of hillocks along the surface of the first electrode layer, such as by being deposited at a temperature which is low enough to prevent or reduce hillock formation. In one embodiment, a hillock temperature can be determined for the first electrode layer where the hillock temperature corresponds to the temperature above which hillock formation is likely (e.g., has been observed during testing). In this embodiment, the deposition temperature for the first dielectric layer can then be chosen to be below the hillock temperature. In one embodiment, the temperature for deposition of the first dielectric layer can be a range of temperatures, such as starting at a low temperature and raising the temperature during the deposition process for the first dielectric layer. In one embodiment, the first dielectric layer can be deposited using a process that enables a columnar-oriented grain structure to be formed, such as via a sputtering process. In another embodiment for depositing the first dielectric layer, a sputtering process can be performed below the hillock temperature thereby preventing or reducing hillock formation while also reducing grain growth, as compared to a high-temperature sputtering process. In one embodiment, the first dielectric layer can heal and planarize possible defects and roughness in the first electrode layer when applied directly to the first electrode layer. In one or more embodiments, the first dielectric layer can be a thin high density dielectric buffer layer, which is sputter-deposited on the electrode layer at a temperature at least 20 degrees lower than a stress relief temperature of the electrode layer, where the first dielectric layer has a grain structure that is columnar.

At 914, a second dielectric layer of ferroelectric material (e.g., BST, SBT, BZN, PZT, PLZT, any other perovskite or pyrochlore phase ferroelectric film or a combination thereof) can be deposited or otherwise formed on the first dielectric layer. In another embodiment, the second dielectric layer can be deposited so as to cover an entire top surface of the first dielectric layer. In one or more embodiments the second dielectric layer has a randomly oriented grain structure and is deposited on the first dielectric layer by MOD or sol-gel deposition, such as spin-deposition or misted deposition. The composition of the second dielectric layers can be the same or different than the first dielectric layer in order to improve or optimize RF and DC properties of the fabricated capacitor.

In one or more embodiments at 916, densification of the second dielectric layers can be performed by an annealing process. For example, the annealing can be performed in $O_2$ or an $O_2$/Carrier gas mixture. In one or more embodiments, this annealing can be at a temperature higher than the deposition temperature of the first dielectric layer. In another embodiment, this annealing can be at a temperature higher that is lower than a final crystallization temperature of the fabricated capacitor.

At 918, the deposition and annealing of the second dielectric layer of tunable high-K dielectric can be repeated until a desired dielectric stack thickness is achieved. In one embodiment, the composition of each layer of second dielectric layer can be the same. In another embodiment, one or more layers of the second dielectric layers can have a different composition than one or more other layers of the second dielectric layers. Various configurations of the same or different materials for the group of dielectric layers can be used, such as alternating layers of different compositions, top and bottom of the group of second dielectric layers having the same composition, gradually adjusting an amount of doping in each adjacent ones of the group of second dielectric layers, and so forth.

The use of the same materials or different materials for the group of dielectric layers can be selected to achieve improved, optimal or selected RF and DC properties. In one or more embodiments, the different compositions can be deposited on a single spin track by having multiple dispense pumps. After the annealing, the resulting dielectric stack can be amorphous and about 70% densified. Final density can be achieved after a final crystallization of the dielectric/electrode stack.

In one embodiment, the group of second dielectric layers can have an overall thickness between 500 A and 50000 A, although other overall thicknesses can be utilized for the second dielectric layers, such as based on the type of dielectric material, the parameters for the capacitor being formed, and so forth. In one embodiment, the thickness of the second dielectric layers can be selected so that they are thin enough to not adversely affect the operation of the capacitor but thick enough to enable suppression of dendrite formation and/or improvement of the time-dependent dielectric breakdown of the capacitor. In one or more embodiments, the second dielectric layers can have the same or different thicknesses. For example where there are three second dielectric layers, a top and bottom second dielectric layer can have the same thickness which is different from the thickness of a middle second dielectric layer.

The second dielectric layers can be layers with randomly oriented grains providing tuning interrupting the vertically oriented grain boundaries of the first dielectric layer of the capacitor resulting in an improvement in the time-dependent dielectric breakdown behavior of the capacitor. As an example, the second dielectric layer can be deposited utilizing a process that forms a randomly-oriented grain structure in the second dielectric layer. For instance, the second dielectric layers can be deposited utilizing a MOD or sol-gel process, such as spin-on deposition or misted deposition. In one embodiment, the deposition of the second dielectric layer can be performed at a low temperature, such as room temperature. In another embodiment, the second dielectric layer can be deposited using room temperature spin-coating deposition process of amorphous film with a following high temperature crystallization anneal.

In one embodiment, densification thermal processing can be applied after the deposition of the second dielectric layer, such as hot plate bakes, oven bakes, and/or vacuum oven bakes. After the initial bake, the dielectric film can remain amorphous with 50-70% increase in film density.

The following crystallization anneal could be an atmospheric furnace anneal, a furnace anneal in reactive ambients, a rapid thermal process, or a vacuum anneal. The temperature profile of the high temperature crystallization film should be adjusted to achieve full crystallization of the film that was amorphous as-deposited. In one embodiment, the second dielectric layer can be deposited using other processes that enable a randomly-oriented grain structure to be formed. The other process could be the misted deposition or LPCVD.

At 920, when the overall desired thickness of the second dielectric layers is achieved, a first crystallization anneal can be performed. In one or more embodiments, the first crystallization anneal can be performed at a temperature of 50-100 C lower than a final crystallization anneal. In one or more embodiments, the grain structure of the second dielectric layers of the capacitor stack after this first crystallization anneal can be microcrystalline and can have the same phase volume as in the previous step. In one embodiment, the thin film at this stage has 90% of its final density. In one or more embodiments, the spin and anneal processes and equipment can be low-cost high-throughput processes that provide a reduced or minimum cost for the fabricated capacitor. For example, a conventional furnace tube will take a load of 50 to 250 wafers for a single anneal step, allowing multiple batches to be processed at the same time.

At 922, a top electrode of conductive material can be deposited on the dielectric or dielectric stack. For example, the second electrode layer of conductive material may be deposited or otherwise formed on the second dielectric layer. For example, the second electrode layer may be deposited directly onto the second dielectric layer. The second electrode layer can be formed of various materials including platinum, platinum alloy, iridium either solely or in combination with iridium oxide, ruthenium oxide, or SRO, any metal or conductive oxide, or any combination of these materials.

At 924, the preceding steps 912-922 can be repeated one or more times to achieve a multi-layer capacitor (MLC). Other processing can be applied to the capacitor structure, such as mesa patterning and etching. Patterning the capacitor layers into a mesa structure can provide access to all electrode layers and capacitor layers for later interconnection.

At 926, a final crystallization annealing can be performed, such as in an $O_2$ or $O_2$/carrier gas mixture. In one or more embodiments, the temperature of the final crystallization annealing can be one of the highest temperatures in method 900 and can be selected to finalize RF and DC properties of the capacitor structure. In one embodiment, the temperature of the final crystallization annealing can be lower than the anneal/densification temperature of the initial oxide. At this stage, the dielectric stack can be fully densified. In one or more embodiments, the dielectric film of dielectric layers resulting from method 900 can have randomly oriented grains with cubic symmetry. The homogeneity of the solution and static forces can result in symmetric para-electric phases that increase the tunability of the capacitor device relative to the vertical columnar structure of sputter-deposited film.

In one embodiment, the first and second dielectric layers can utilize a combination of an undoped BST and a doped BST formulation, or a combination of different ferroelectric materials to facilitate reducing space charge effects and/or improving a temperature dependence of the dielectric properties of the capacitor.

In one embodiment where the first electrode layer is platinum, the hillock temperature for the platinum electrode layer can be selected to be 600 C and the first dielectric layer can be sputtered at a first temperature at or below 600 C. Other temperatures can be selected (including a temperature range or temperature ramp) so as to reduce or eliminate hillock formation depending on the type of materials being utilized and the deposition processes being employed. In one embodiment, the grain sizes of the first dielectric layer can be smaller than the grain sizes of the second dielectric layer(s), such as an average grain size of the first dielectric layer being smaller than an average grain size of the second dielectric layer(s).

In one embodiment, a planarizing and/or insulating layer can be deposited on top of the previously deposited layers, such as over the second electrode layer 118 or over the second dielectric layer. The planarizing and/or insulating layer can be etched to form a set of pathways or vias in the capacitor structure. These etched vias can provide conduits for metal interconnection materials to be deposited.

In one embodiment, such as following deposition and etching of the planarizing and/or insulating layer if such layer(s) are deposited, one or more metal interconnect layers can be deposited. The metal interconnect layer(s) can create electrical connections for the thin film capacitor.

In one embodiment, the electrodes can be patterned electrodes and the first and second dielectric layers can be formed on the patterned electrodes. For example, the electrode layer can only partially cover the substrate due to patterning of the electrode layer on the substrate. In one embodiment, the dielectric layer can completely cover the patterned electrode layer.

In one embodiment following deposition of the metal interconnect layer, an additional layer of protective material, such as a silicon nitride overcoat, may be deposited on top of the metal interconnect layer and/or gold bumps may be attached to the metal connections to help protect the previously deposited structures.

Figure 10:
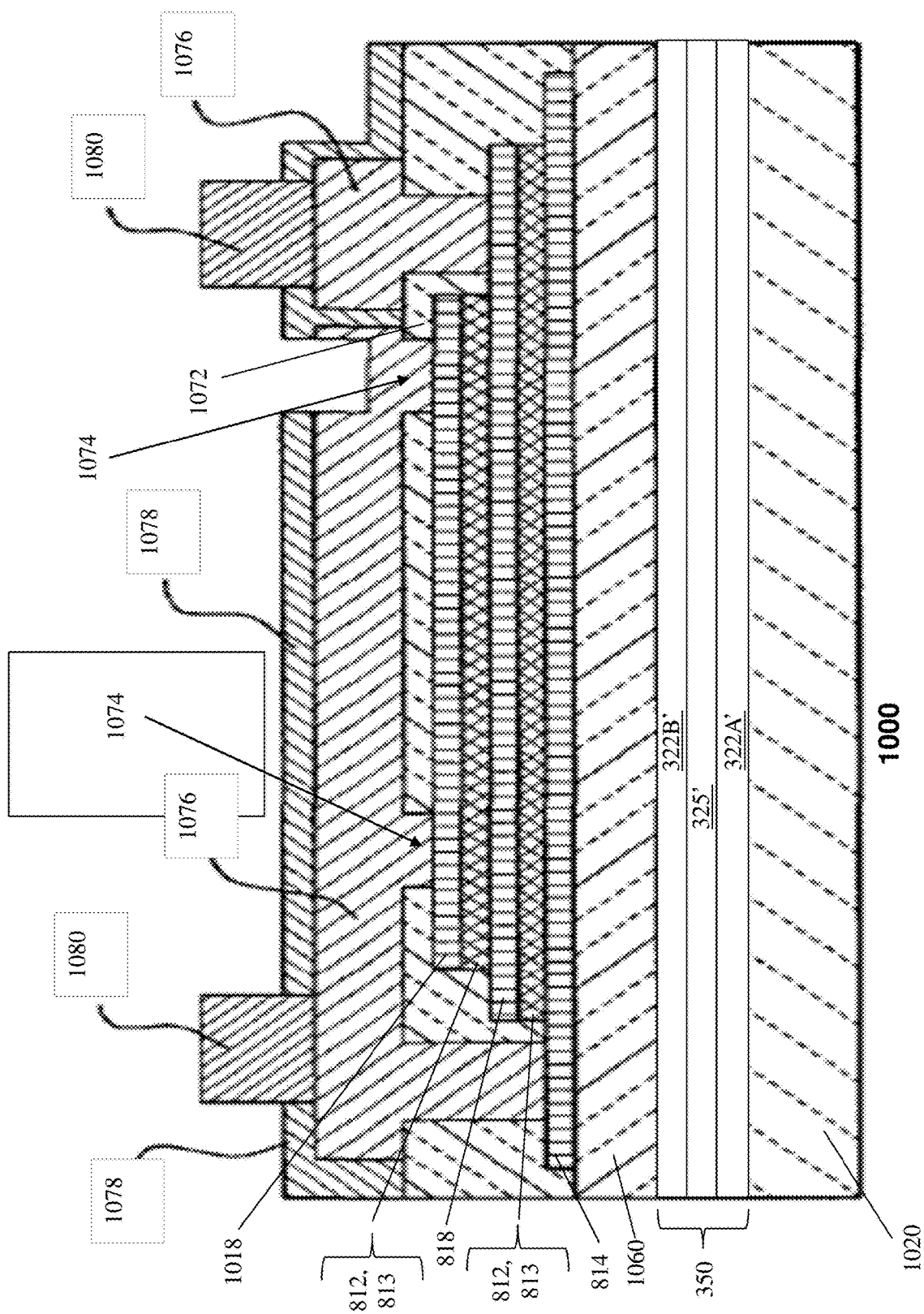
FIG. 10 illustrates another exemplary embodiment of a thin film capacitor having multiple dielectric layers.

FIG. 10 depicts a device or structure 1000 (e.g. a tunable dielectric capacitor) that includes two sets of stacked dielectric layers, which in this example are dielectric layers 812, 813, and which utilizes a polar dielectric adhesion layer on an annealed multilayer initial oxide 350 which is formed from deposition of silicon dioxide layers and a modifier layer as described herein. The annealed multilayer initial oxide 350 includes polysilicates that compensate for the TEC mismatch with the silicon substrate 1020. Structure 1000 includes the annealed multilayer initial oxide 350 being utilized in conjunction with an adhesion layer 1060, and a multilayer dielectric 812, 813 that is in a stacked configuration. The exemplary embodiments can include any combination of the features described with respect to structure 1000, such as the annealed multilayer initial oxide 350 (or a stacked annealed multilayer initial oxide) being utilized alone or in conjunction with a single or multilayer adhesion layer, and a single dielectric (e.g., dielectric 813) that is in a single capacitor configuration or a stacked capacitor configuration.

Any number of sets of stacked dielectric layers 812, 813 can be utilized and various other connections can be implemented. In one embodiment, the dielectric layer 813 is a group of dielectric layers (e.g., formed according to method 900 and that have a random-oriented grain structure) deposited directly on dielectric layer 812 having columnar-oriented grains structures. The deposition process for the dielectric layer 812 and the dielectric layers 813 can be different, such as depositing the dielectric layer 812 at a low temperature which is below the temperature at which hillock formation occurs and depositing the dielectric layer 813 at a high temperature. The stacked capacitors in FIG. 10 can share a middle electrode 818.

In one embodiment, an adhesion layer 1060 comprising a polar dielectric is deposited on the annealed multilayer initial oxide 350 of the silicon substrate 1020. In another embodiment, the adhesion layer can be multiple adhesion layers where the first adhesion layer is a polar dielectric layer and another layer is a thin film Ti, Ta, TiOx and TaOx.

The sets of dielectric layers 812, 813 and the electrode layers 814, 818, 1018 are patterned to form a particular structure, such as a mesa structure, to facilitate providing an electrical connection to each electrode layer.

In one embodiment, a planarizing and insulating layer 1072 (e.g., an ILD glass layer) can be deposited, patterned and etched to form vias 1074. A metal interconnect layer 1076 can be deposited over the planarizing and insulating layer 1072 and into the vias 1074 to provide an electrical connection to the electrodes 814, 818, 1018. In one embodiment, a nitride overcoat 1078 can be deposited to protect the metal interconnect layer 1076 and gold bumps 1080 can be deposited to provide electrical contacts for final packaging.

In one or more embodiments of capacitor 1000, an edge alignment spacing between at least one pair of corresponding electrode edges of two electrode layers of the capacitor is two microns or less. In one or more embodiments, the edge alignment is coincident (which can be no gap or can include a gap of 0.4 microns or less). As an example, the edges of electrode layers 818, 1018 and/or 814, 818 can be coincident or can have an edge alignment spacing of 2.0 microns or less.

In one or more embodiments, the process can be used for different substrates. Silicon wafers can have stack stresses that are very high because of the high thermal mismatch between Si/SiO$_2$ wafers and Pt/tunable dielectric/Pt stack. Sapphire and Alumina wafers may have lower levels of stress such as depending on the configuration.

The adhesion layer described herein can be or otherwise include a polar dielectric material provided on a modified initial oxide of a silicon substrate to prevent delamination such as between an electrode layer and the modified initial oxide. In one or more embodiments, the modified initial oxide(s) in combination particular adhesion layer(s) can be used with silicon substrates and can facilitate the electrode layer adhering to the substrate. In one or more embodiments, the polar dielectric can be selected from the family of alkali or alkali earth titanate, zirconate, niobate, silicate, and tantalite or the mixture thereof.

In one or more embodiments, an efficient adhesion layer is utilized for fabrication of tunable capacitors (e.g. voltage tunable capacitors) on Si substrates using high-K dielectrics. One or more of the exemplary embodiments can utilize a single-layer or multi-layer (e.g., double) adhesion layer for a silicon substrate, such as where the first layer is a low temperature deposited oxide layer of a polar dielectric, (e.g., barium-strontium-titanate (BST)). The polar dielectric layer provides strong adhesion strength to the modified field oxide described herein. In one or more embodiments, a second or subsequent layer(s) can be utilized over the polar dielectric adhesion layer where the second or subsequent layer(s) are other types of adhesion layers, including thin film Ti, Ta, TiOx and TaOx.

In one or more embodiments, the adhesive strength can be dependent on the chemical affinity of the adhesion layer to the modified initial oxide and to the electrode material. The electrode materials can be chosen from metals, electrically conductive compounds, or multilayer compositions thereof. To adhere to the modified initial oxide (e.g., amorphous poly-silicate) chemically, the material of adhesion layer can be selected with one or more of the following properties:

(1) reacts to create Me-O—Si bonds of higher polarity than the polarity of Si—O bonds;

(2) has a low mismatch in thermal expansion coefficient with the electrode material since there is mostly chemical-physical, rather than chemical bonding in case of electrodes made of noble metals;

(3) should not create intermetallic compounds reacting with the electrode materials since that will result in defects in the electrodes; and (4) provides smooth and uniform interface for the electrode deposition.

Polar dielectric adhesion layers have a number of advantages. Polar dielectrics, such as alkali metal titanates and alkali-earth metal titanates, can be more reactive with the initial oxide. Polar dielectrics have more polar bonding with lower energy of dissociation as compared to the materials described above for conventional adhesion layers. This results in more easily creating strong —Ti—O-Me-O—Si— chemical bonds. The alkali titanates/tantalates can be very reactive with the initial oxide but they can also create intermetallics with the electrode material. In that situation, a double layer adhesion layer (e.g., a polar dielectric adhesion layer followed by a conventional adhesion layer) can provide strong adhesion. More polar titanates and tantalates are also having higher thermal expansion coefficients than less polar oxides and lower thermal mismatch with electrode materials as a result of that.

In one or more embodiments, the adhesion layer(s) can be poly-crystalline or amorphous. In another embodiment, the adhesion layer(s) can have a smooth, uniform structure. In one or more embodiments, the deposition technique can result in a continuous thin uniform layer. PVD (e.g., sputtering or PLD) can be a preferred deposition technique since the resulting film has high physical density, which can reduce minimum thickness.

In one or more embodiments, the thickness of the adhesion layer or the multiple adhesion layers can be about 50 A to 500 A thick. In one or more embodiments, the deposition and/or anneal temperature can be selected based on the materials involved. For example, the higher the bond polarity (and reactivity)—the lower the temperature required for Me-O—Si bond formation. Alkali earth titanates can adhere well at room temperature, while BST can require a temperature of about 200 C and up. The higher the temperature that is used can result in the rougher the grain.

Fabrication of tunable thin film capacitors with high-K dielectrics utilizes high processing temperatures for the deposition of the dielectric and/or post-deposition anneals. Most of these anneals are done in oxygen. The electrodes can be of uniform composition or have multiple layers comprised of conductive, semiconductive or resistive materials. The electrode materials can be chosen from metals, electrically conductive compounds, or multilayer compositions thereof, such as pure Pt, Ir, Ru, Os, Au metal alloys, conductive or resistive oxides, and can include metal diffusion barriers, hillock suppressors, shunt conductors and composites. Conductive compounds like TiN, SiCr, ITO (Indium Tin Oxide), SRO (Strontium Ruthenium Oxide), etc. also can be used as all or part of the electrodes.

Examples of the capacitor can include single dielectric layer and multiple dielectric layer capacitors. The components and techniques described in U.S. application Ser. No. 14/642,222 filed Mar. 9, 2015 and U.S. application Ser. No. 15/184,081 filed Jun. 16, 2016 are hereby incorporated by reference herein in their entirety. These applications describe configurations and fabrication techniques, including particular deposition processes and parameters of those processes, that can be used with one or more of the exemplary embodiments described herein, including in addition to components or steps of the exemplary embodiments or in place of components or steps of the exemplary embodiments.

Upon reviewing the aforementioned embodiments, it would be evident to an artisan with ordinary skill in the art that said embodiments can be modified, reduced, or enhanced without departing from the scope of the claims described below.

For example, the annealed multilayer initial oxide that has, via diffusion, resulted in amorphous polysilicates can be utilized with various devices where a TEC mismatch needs to be overcome. The exemplary embodiments are described with respect to silicon substrates but one or more of the embodiments can be utilized in various configurations and with various substrates (that may or may not be silicon substrates) to alleviate a TEC mismatch. The use of the annealed multilayer initial oxide(s) and/or the polar dielectric adhesion layer(s) with a Si substrate can be utilized with various configurations of capacitors, including single layer dielectric capacitors and multi-layer dielectric capacitors. In one or more embodiments, edge alignment gaps or spacing between corresponding edges of two electrode layers can be 2.0 microns or less. In another embodiment, edge alignment gaps or spacing between corresponding edges of two electrode layers can be 1.0 microns or less. In another embodiment, edge alignment gaps or spacing between corresponding edges of two electrode layers can be 0.5 microns or less. In another embodiment, edge alignment gaps or spacing between corresponding edges of two electrode layers can be 0.4 microns or less. In another embodiment, edge alignment gaps or spacing between corresponding edges of two electrode layers can be 0.1 microns or less.

As another example, the dielectric stack can be configured such that at the interface with the electrodes the same or similar crystal grain structure is maintained and/or the same or similar dielectric composition exists. In this example, the same crystal grain structure (columnar) and the same dielectric composition (e.g., BST) exists at the top and bottom electrode interfaces. In addition it would be evident to an artisan of ordinary skill in the art that the temperature of various anneals including the modified field oxide anneal, and the crystallization anneals can be varied according to the final capacitor performance requirements.

In one or more embodiments, a sputtering target can be selected or fabricated (and utilized in one or more of the exemplary embodiments) according to one or more of the features or process steps of U.S. Patent Publication No. 20140216921, the disclosure of which is hereby incorporated by reference.

In one embodiment, a deposition of a thin sputtered buffer layer (e.g., doped BST) on a conductive electrode can be performed plus a spin-deposition and anneal of one or more metal-organic (MOD) or sol-gel deposited layers. In one or more embodiments, an intermediate crystallization anneal may be performed once a final dielectric thickness is obtained and/or a final crystallization anneal may be performed after the dielectric/electrode stack has been formed.

One or more of the exemplary embodiments can give a much lower cost method of fabricating high-quality tunable dielectric material devices and/or can give much better flexibility in composition of the dielectric stack.

One or more of the exemplary embodiments can reduce or eliminate dendrite formation. In one or more embodiments, the first thin dense layer of dielectric is deposited at the temperature lower than stress relief temperature of the electrode, which can reduce or eliminate hillock formation on the electrode(s) resulting in high breakdown voltage. The systems and methods described herein provide a composite high-k thin film stack which improves the time-dependent dielectric breakdown of the thin film capacitor.

One or more features and/or process steps described in U.S. Pat. Nos. 8,154,850, 8,693,162, 8,664,704, 5,745,335, U.S. Patent Publication No. 20140216921, and U.S. application Ser. No. 14/642,222 can be utilized in place of or in addition to one or more features and/or process steps described herein with respect to the exemplary embodiments. The disclosures of U.S. Pat. Nos. 8,154,850, 8,693,162, 8,664,704, 5,745,335, U.S. Patent Publication No. 20140216921, and U.S. application Ser. No. 14/642,222 are incorporated herein by reference in their entirety.

One or more of the thin film capacitors described with respect to the exemplary embodiments can be utilized in various components including tunable filters, voltage controlled oscillators, tunable phase shifters, tunable matching networks, low-impedance power supplies, decoupling high-frequency signals at an IC bonding pad, mobile phone components (where the mobile phone includes an antenna and a transceiver) or others. Integrated circuits including ferroelectric capacitors described with respect to the exemplary embodiments may, for example, be used in portable electronics for low-power wireless communication (e.g., cellular phones, pagers, PDAs, and so forth), directional antenna systems, high clock-rate microphones, miniature DC to DC converters, or other devices.

Other embodiments can be applied to the subject disclosure without departing from the scope of the claims described below.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, are contemplated by the subject disclosure.

For instance, one or more features from one or more embodiments can be combined with one or more features of one or more other embodiments. In one or more embodiments, features that are positively recited can also be negatively recited and excluded from the embodiment with or without replacement by another structural and/or functional feature. The steps or functions described with respect to the embodiments of the subject disclosure can be performed in any order. The steps or functions described with respect to the embodiments of the subject disclosure can be performed alone or in combination with other steps or functions of the subject disclosure, as well as from other embodiments or from other steps that have not been described in the subject disclosure. Further, more than or less than all of the features described with respect to an embodiment can also be utilized.

Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for compensation for a Thermal Expansion Coefficient (TEC) mismatch for a silicon substrate of a device, the method comprising:
    providing a first silicon dioxide layer on the silicon substrate;
    depositing a modifier layer on the first silicon dioxide layer;
    depositing a second silicon dioxide layer on the modifier layer to form a multilayer initial oxide; and
    annealing the multilayer initial oxide resulting in an annealed multilayer initial oxide, wherein the annealing causes diffusion of modifier species from the modifier layer into the first and second silicon dioxide layers and results in amorphous polysilicates, the first and second silicon dioxide layers having thicknesses that prevent the diffusion of the modifier species from reaching top and bottom interfaces of the annealed multilayer initial oxide, wherein the annealed multilayer initial oxide compensates for the TEC mismatch for the silicon substrate, thereby mitigating delamination.

2. The method of claim 1, wherein the device is a tunable capacitor and further comprising:
    depositing a first electrode layer on the annealed multilayer initial oxide;
    depositing a dielectric layer on the first electrode layer;
    depositing a second electrode layer on the dielectric layer; and
    providing connections for the first and second electrode layers.

3. The method of claim 2, wherein the modifier layer and the dielectric layer comprise a same material and are deposited utilizing a same technique.

4. The method of claim 1, wherein an edge alignment spacing between at least one pair of corresponding electrode edges of two electrode layers of the device is two microns or less.

5. The method of claim 4, wherein an edge alignment spacing is 0.4 microns or less.

6. The method of claim 1, wherein the providing the first silicon dioxide layer is by one of thermal oxidation or a deposition process selected from low pressure chemical vapor deposition, atmospheric pressure chemical vapor deposition, tetraethyl orthosilicate deposition, or a combination thereof, and wherein the depositing the modifier layer is by a deposition process selected from chemical vapor deposition, spin-on of metal-organic precursor, or sputtering.

7. The method of claim 1, wherein the modifier layer comprises a group one metal or a group two metal.

8. The method of claim 1, wherein the modifier layer comprises Lithium Niobate, Lead Lanthanum Zirconate Titanate, Lead Zirconate Titanate, Barium Titanate, Strontium Titanate, or Barium Strontium Titanate.

9. The method of claim 1, wherein the annealed multilayer initial oxide is a first annealed multilayer initial oxide and further comprising:
    depositing a third silicon dioxide layer on the first annealed multilayer initial oxide;
    depositing a second modifier layer on the third silicon dioxide layer;
    depositing a fourth silicon dioxide layer on the second modifier layer to form a second multilayer initial oxide; and
    performing a second annealing of the second multilayer initial oxide resulting in a second annealed multilayer initial oxide on the first annealed multilayer initial oxide, wherein the second annealing causes diffusion of modifier species from the second modifier layer into the third and fourth silicon dioxide layers and results in amorphous polysilicates.

10. The method of claim 1, wherein the annealing is at a temperature between 950-1100 C.

11. The method of claim 1, further comprising:
    depositing an adhesion layer on the annealed multilayer initial oxide, wherein the adhesion layer comprises a polar dielectric;
    depositing a first electrode layer on the adhesion layer;
    depositing a dielectric layer on the first electrode layer; and
    depositing a second electrode layer on the dielectric layer.

12. A method for compensation for a Thermal Expansion Coefficient (TEC) mismatch for a silicon substrate of a device, the method comprising:
    providing a first silicon dioxide layer on the silicon substrate;
    depositing a modifier layer on the first silicon dioxide layer;
    depositing a second silicon dioxide layer on the modifier layer to form a multilayer initial oxide;
    annealing the multilayer initial oxide resulting in an annealed multilayer initial oxide, wherein the annealing causes diffusion of modifier species from the modifier layer into the first and second silicon dioxide layers and results in amorphous polysilicates, the first and second silicon dioxide layers having thicknesses that prevent the diffusion of the modifier species from reaching top and bottom interfaces of the annealed multilayer initial oxide, wherein the annealed multilayer initial oxide compensates for the TEC mismatch for the silicon substrate, thereby mitigating delamination; and depositing an adhesion layer on the annealed multilayer initial oxide, wherein the adhesion layer comprises a polar dielectric, wherein an edge alignment spacing between at least one pair of corresponding electrode edges of two electrode layers of the device is two microns or less.

13. The method of claim 12, wherein the modifier layer comprises Lithium Niobate, Lead Lanthanum Zirconate Titanate, Lead Zirconate Titanate, Barium Titanate, Strontium Titanate, or Barium Strontium Titanate.

14. A method for compensation for a Thermal Expansion Coefficient (TEC) mismatch for a silicon substrate of a device, the method comprising:

providing a first silicon dioxide layer on the silicon substrate;

depositing a modifier layer on the first silicon dioxide layer;

depositing a second silicon dioxide layer on the modifier layer to form a multilayer initial oxide; and annealing the multilayer initial oxide resulting in an annealed multilayer initial oxide, wherein the annealing causes diffusion of modifier species from the modifier layer into the first and second silicon dioxide layers and results in amorphous polysilicates, the first and second silicon dioxide layers having thicknesses that prevent the diffusion of the modifier species from reaching top and bottom interfaces of the annealed multilayer initial oxide, wherein the annealed multilayer initial oxide compensates for the TEC mismatch for the silicon substrate, thereby mitigating delamination, wherein an edge alignment spacing between at least one pair of corresponding electrode edges of two electrode layers of the device is two microns or less, and wherein the modifier layer comprises a group one metal or a group two metal.

15. The method of claim 14, wherein an edge alignment spacing is 0.4 microns or less.

16. The method of claim 14, wherein the providing the first silicon dioxide layer is by one of thermal oxidation or a deposition process selected from low pressure chemical vapor deposition, atmospheric pressure chemical vapor deposition, tetraethyl orthosilicate deposition, or a combination thereof.

17. The method of claim 14, wherein the depositing the modifier layer is by a deposition process selected from chemical vapor deposition, spin-on of metal-organic precursor, or sputtering.

18. The method of claim 14, wherein the modifier layer comprises Lithium Niobate, Lead Lanthanum Zirconate Titanate, Lead Zirconate Titanate, Barium Titanate, Strontium Titanate, or Barium Strontium Titanate.

19. The method of claim 14, further comprising:

depositing an adhesion layer on the annealed multilayer initial oxide, wherein the adhesion layer comprises a polar dielectric;

depositing a first electrode layer on the adhesion layer;

depositing a dielectric layer on the first electrode layer; and depositing a second electrode layer on the dielectric layer.

20. The method of claim 14, wherein the device is a tunable capacitor and further comprising:

depositing a first electrode layer on the annealed multilayer initial oxide;

depositing a dielectric layer on the first electrode layer;

depositing a second electrode layer on the dielectric layer; and providing connections for the first and second electrode layers.

* * * * *